(12) United States Patent
Klenner

(10) Patent No.: US 11,876,727 B2
(45) Date of Patent: *Jan. 16, 2024

(54) TIME INTERLEAVER, TIME DEINTERLEAVER, TIME INTERLEAVING METHOD, AND TIME DEINTERLEAVING METHOD

(71) Applicant: Panasonic Holdings Corporation, Osaka (JP)

(72) Inventor: Peter Klenner, Frankfurt (DE)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/110,468

(22) Filed: Feb. 16, 2023

(65) Prior Publication Data

US 2023/0216807 A1 Jul. 6, 2023

Related U.S. Application Data

(63) Continuation of application No. 17/887,793, filed on Aug. 15, 2022, now Pat. No. 11,611,515, which is a
(Continued)

(30) Foreign Application Priority Data

Sep. 29, 2014 (EP) ..................................... 14186891
Sep. 1, 2015 (JP) ................................. 2015-171835

(51) Int. Cl.
*H04L 47/62* (2022.01)
*H03M 13/27* (2006.01)
(Continued)

(52) U.S. Cl.
CPC ........ *H04L 47/6245* (2013.01); *H03M 13/27* (2013.01); *H03M 13/271* (2013.01);
(Continued)

(58) Field of Classification Search
CPC . H04L 47/6245; H04L 1/0071; H04L 1/0076; H04L 1/0085; H04L 47/6255;
(Continued)

(56) References Cited

U.S. PATENT DOCUMENTS 3,652,998 A 3/1972 Forney, Jr.
2001/0031017 A1* 10/2001 Betts ....................... H04L 5/143
375/265

(Continued)

FOREIGN PATENT DOCUMENTS

EP 2 048 789 4/2009
GB 2329804 A 3/1999

(Continued)

OTHER PUBLICATIONS

International Search Report of PCT Application No. PCT/JP2015/004609 dated Oct. 13, 2015.
(Continued)

*Primary Examiner* — Mewale A Ambaye
(74) *Attorney, Agent, or Firm* — Wenderoth, Lind & Ponack, L.L.P.

(57) ABSTRACT

A convolutional interleaver included in a time interleaver, which performs convolutional interleaving includes: a first switch that switches a connection destination of an input of the convolutional interleaver to one end of one of a plurality of branches; a FIFO memories provided in some of the plurality of branches except one branch, wherein a number of FIFO memories is different among the plurality of branches; and a second switch that switches a connection destination of an output of the convolutional interleaver to another end of one of the plurality of branches. The first and second switches switch the connection destination when the plurality of cells as many as the codewords per frame have passed, by switching a corresponding branch of the connec-
(Continued)

tion destination sequentially and repeatedly among the plurality of branches.

2 Claims, 20 Drawing Sheets

Related U.S. Application Data continuation of application No. 17/159,550, filed on Jan. 27, 2021, now Pat. No. 11,451,487, which is a continuation of application No. 16/559,939, filed on Sep. 4, 2019, now Pat. No. 10,938,735, which is a continuation of application No. 16/152,966, filed on Oct. 5, 2018, now Pat. No. 10,454,841, which is a continuation of application No. 15/886,068, filed on Feb. 1, 2018, now Pat. No. 10,122,644, which is a continuation of application No. 15/092,696, filed on Apr. 7, 2016, now Pat. No. 9,935,890, which is a continuation of application No. PCT/JP2015/004609, filed on Sep. 10, 2015.

(51) Int. Cl.
*H04L 1/00* (2006.01)
*H04L 47/625* (2022.01)

(52) U.S. Cl.
CPC ..... *H03M 13/276* (2013.01); *H03M 13/2732* (2013.01); *H03M 13/2785* (2013.01); *H03M 13/2796* (2013.01); *H04L 1/0071* (2013.01); *H04L 1/0076* (2013.01); *H04L 1/0085* (2013.01); *H04L 47/6255* (2013.01)

(58) Field of Classification Search
CPC .......... H04L 5/00; H04L 27/26; H03M 13/27; H03M 13/271; H03M 13/2732; H03M 13/276; H03M 13/2785; H03M 13/2796; H04B 7/022
See application file for complete search history.

(56) References Cited

U.S. PATENT DOCUMENTS

| | | | | |
|---|---|---|---|---|
| 2002/0090938 A1* | 7/2002 | Dharia | ................... | H04B 1/715 455/560 |
| 2004/0181556 A1 | 9/2004 | Ko | | |
| 2006/0026488 A1 | 2/2006 | Kim | | |
| 2006/0107174 A1* | 5/2006 | Heise | ................ | H03M 13/2789 714/755 |
| 2006/0259843 A1* | 11/2006 | Welborn | ............... | H04L 1/0041 714/746 |
| 2007/0011559 A1* | 1/2007 | Cioffi | ................ | H03M 13/2757 714/755 |
| 2007/0064588 A1* | 3/2007 | Kisoda | ............... | H04N 21/6112 370/208 |
| 2007/0079224 A1* | 4/2007 | Limberg | ............... | H04L 1/0054 714/792 |
| 2007/0107174 A1 | 5/2007 | Bordas | | |
| 2009/0124284 A1* | 5/2009 | Scherzer | ........... | H04M 1/72457 455/552.1 |
| 2015/0003544 A1 | 1/2015 | Ouchi | | |
| 2016/0056922 A1 | 2/2016 | Baek | | |
| 2016/0218909 A1 | 7/2016 | Baek | | |
| 2017/0063494 A1 | 3/2017 | Loghin | | |
| 2017/0180077 A1 | 6/2017 | Kwak | | |
| 2017/0310423 A1 | 10/2017 | Lim | | |

FOREIGN PATENT DOCUMENTS

| | | |
|---|---|---|
| KR | 10-1998-0087495 A | 12/1998 |
| WO | 2010/061184 | 6/2010 |

OTHER PUBLICATIONS

ETSI EN 303 105 V1.1.1, "Next Generation broadcasting system to Handheld, physical layer specification (DVB-NGH)" DVB Document A160, Nov. 2012.
ETSI TS 102 831 V1.2.1, Implementation guidelines for a second generation digital terrestrial television broadcasting system (DVB-T2) Aug. 2012.
ETSI EN 302 769 V1.2.1, "Frame structure channel coding and modulation for a second generation digital transmission system for cable systems (DVB-C2)" Apr. 2011.
Extended European Search Report dated May 11, 2015 in European Application No. 14186891.9.
David Gómez-Barquero et al., "DVB-NGH: The Next Generation of Digital Broadcast Services to Handheld Devices", IEEE Transactions on Broadcasting, vol. 60, No. 2, Jun. 2014, pp. 246-257.
Pedro F. Gómez et al., "Time Interleaving in DVB-NGH", Next Generation Mobile Broadcasting, Chapter 12, Mar. 26, 2013.
Catherine Douillard et al., "The Bit Interleaved Coded Modulation Module for DVB-NGH", 19th International Conference on Telecommunications, Apr. 25, 2012, pp. 1-6 [retrieved from internet on Oct. 17, 2012 http://ieee.org/stamp/stamp.jsp?tp=&arnumber=6221327 ].
DVB Organization, "TM-NGH810rl Optimised time interleaving for DVB-NGH r2.pdf", Apr. 10, 2011, pp. 1-17.
Extended European Search Report dated Oct. 27, 2017 in European patent application No. 15847888.3.
Hanna S. A. "Convolutional interleaving for digital radio communications", Universal Personal Communications, 1993. Personal Communications: Gate Way to the 21st Century. Conference Record., 2nd International Conference on Ottawa, Ont., Canada Oct. 1, 12-15, New York, NY, USA, IEEE, vol. 1, Oct. 12, 1993 (Oct. 12, 1993), pp. 443-447, XP010198240, DOI: 10.1109/ICUPC.1993.528424 ISBN: 978-0-7803-1396-5.

* cited by examiner

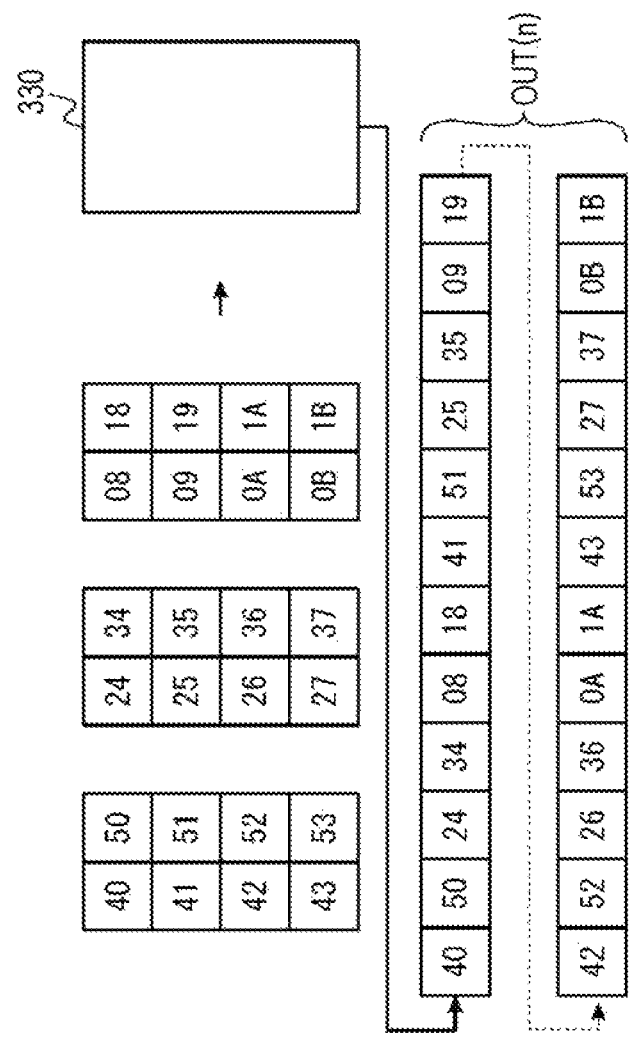

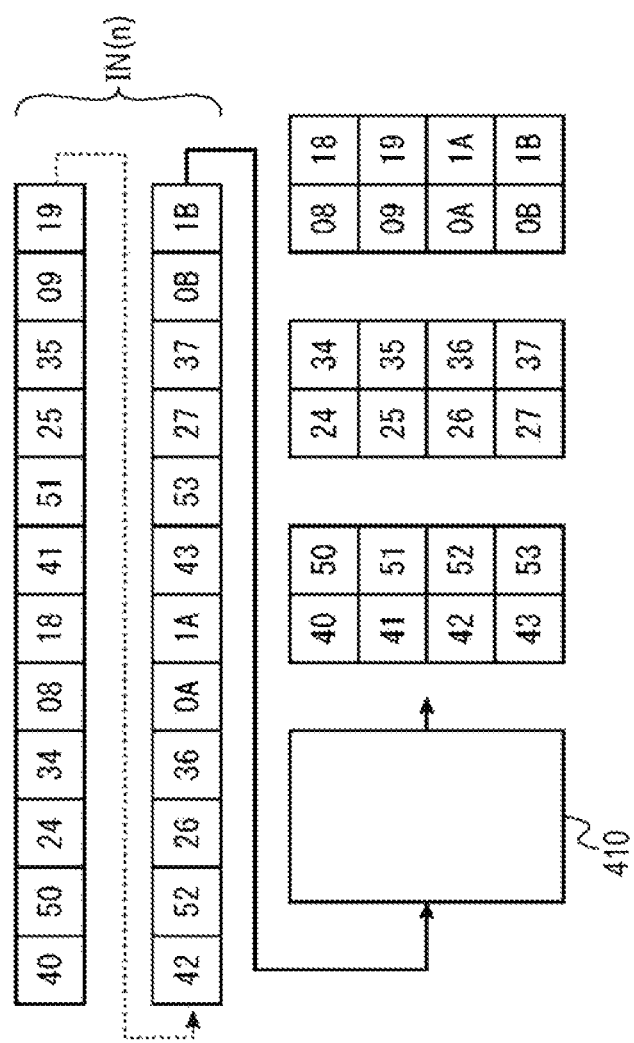

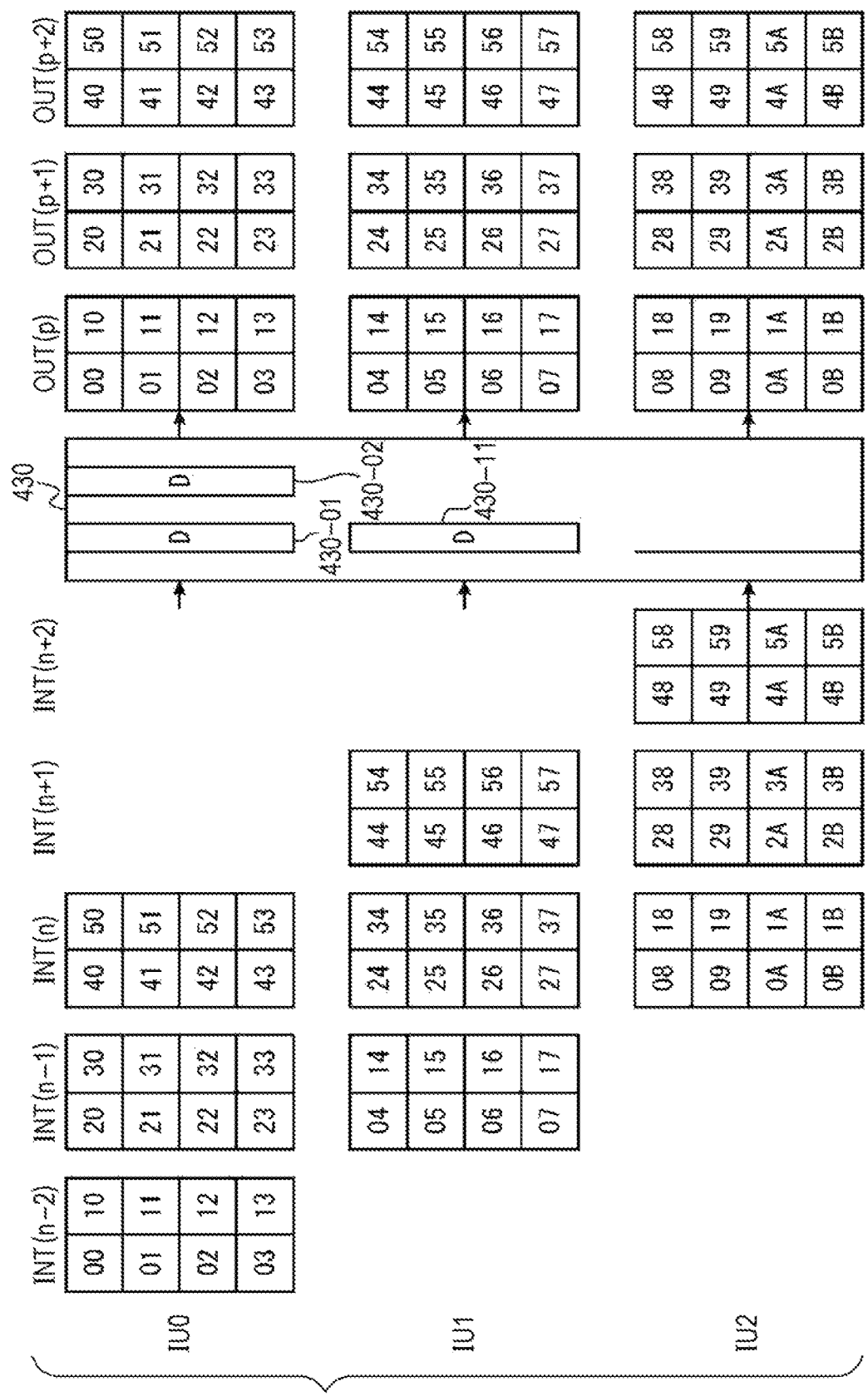

500: TIME INTERLEAVER

TIME INTERLEAVER, TIME DEINTERLEAVER, TIME INTERLEAVING METHOD, AND TIME DEINTERLEAVING METHOD

This application is a continuation of U.S. application Ser. No. 17/887,793 filed Aug. 15, 2022, which is a continuation of U.S. application Ser. No. 17/159,550 filed Jan. 27, 2021, now U.S. Pat. No. 11,451,487, which is a continuation of U.S. application Ser. No. 16/559,939 filed Sep. 4, 2019, now U.S. Pat. No. 10,938,735, which is a continuation of U.S. application Ser. No. 16/152,966, filed Oct. 5, 2018, now U.S. Pat. No. 10,454,841, which is a continuation of Ser. No. 15/886,068, filed Feb. 1, 2018, now U.S. Pat. No. 10,122,644, which is a continuation of Ser. No. 15/092,696, filed Apr. 7, 2016, now U.S. Pat. No. 9,935,890, which is a continuation of PCT International Application No. PCT/JP2015/004609, filed Sep. 10, 2015, which is based on European Patent Application No. 14186891.9 filed on Sep. 29, 2014, the entire content of which is hereby incorporated by reference.

TECHNICAL FIELD

This application is based on European Patent Application No. 14186891.9 filed on Sep. 29, 2014, the entire content of which is hereby incorporated by reference.

The present disclosure relates to a digital communication field, more particularly to a time interleaver that time-interleaves a plurality of cells and a time deinterleaver corresponding to the time interleaver.

BACKGROUND ART

Conventionally, in a transmitter including a bit-interleaved coding and modulation (BICM) encoder in which quasi-cyclic low-density parity-check code (QC LDPC) and quadrature amplitude modulation (QAM) are used, a time interleaver that time-interleaves a plurality of cells generated by the BICM encoder is known. And a time deinterleaver corresponding to the time interleaver in a receiver is known.

As an example of the time interleaver and the time deinterleaver, a hybrid interleaver that performs hybrid interleaving, in which block interleaving and convolutional interleaving are used in combination as described in a DVB-NGH specification (NPL 1), and a corresponding hybrid deinterleaver are known.

CITATION LIST

Patent Literature

PTL 1: WO2010/061184

Non-Patent Literatures

NPL 1: DVB-NGH specification DVB BlueBook A160 (Draft ETSI EN 3 03 105) "Digital Video Broadcasting (DVB); Next Generation broadcasting system to Handheld physical layer specification (DVB-NGH)", November 2012

NPL 2: DVB-T2 implementation guidelines ETSI TS 102 831 "Digit al Video Broadcasting (DVB); Implementation guidelines for a second generation digital terrestrial television broadcasting system (DVB-T2)", v1.2.1, August 2012

NPL 3: DVB-C2 specification ETSI EN 302 769 "Digital Video Broadcasting (DVB); Frame structure channel coding and modulation for a second generation digital transmission system for cable systems (DVB-C 2)", v1.2.1, April 2011

SUMMARY OF THE INVENTION

According to one aspect of the present disclosure, in a time interleaver that performs time interleaving that includes convolutional interleaving on a plurality of cells, wherein a convolutional interleaver that performs the convolutional interleaving comprises: a first switch that switches a connection destination of an input of the convolutional interleaver to one end of one of a plurality of branches, a number of which is same as a number of interleaving units on which a cell to be interleaved is disposed; FIFO (first in, first out) memories provided in some of the plurality of branches except one branch, wherein a number of FIFO memories is different among the plurality of branches except the one branch; and a second switch that switches a connection destination of an output of the convolutional interleaver to another end of one of the plurality of branches, and wherein the first switch switches the connection destination of the input of the convolutional interleaver when the plurality of cells as many as the codewords per frame have passed, by switching a corresponding branch of the connection destination sequentially and repeatedly among the plurality of branches, and wherein the second switch switches the connection destination of the output of the convolutional interleaver when the plurality of cells as many as the codewords per frame have passed, by switching a corresponding branch of the connection destination sequentially and repeatedly among the plurality of branches.

BRIEF DESCRIPTION OF DRAWINGS

FIG. 3C is a view illustrating an outline example of the time-interleaver logical operation based on the DVB-NGH specification.

FIG. 4A is a view illustrating an outline example of a time-deinterleaver logical operation based on the DVB-NGH specification.

FIG. 4C is a view illustrating an outline example of the time-deinterleaver logical operation based on the DVB-NGH specification.

DESCRIPTION OF EMBODIMENT (Discussion Items of the Inventors)

The DVB-NGH specification (NPL 1) only mentions time-interleaved transmission sequences for a plurality of cells, and does not describes an actual method for generating the transmission sequences.

The present disclosure discloses a method and a device for specifically implementing a time interleaver and a corresponding time deinterleaver.

An application target of the present disclosure is not limited to broadcasting based on DVB-NGH, the coding scheme is not limited to QC LDPC coding, and the modulation scheme is not limited to QAM.

Figure 1:
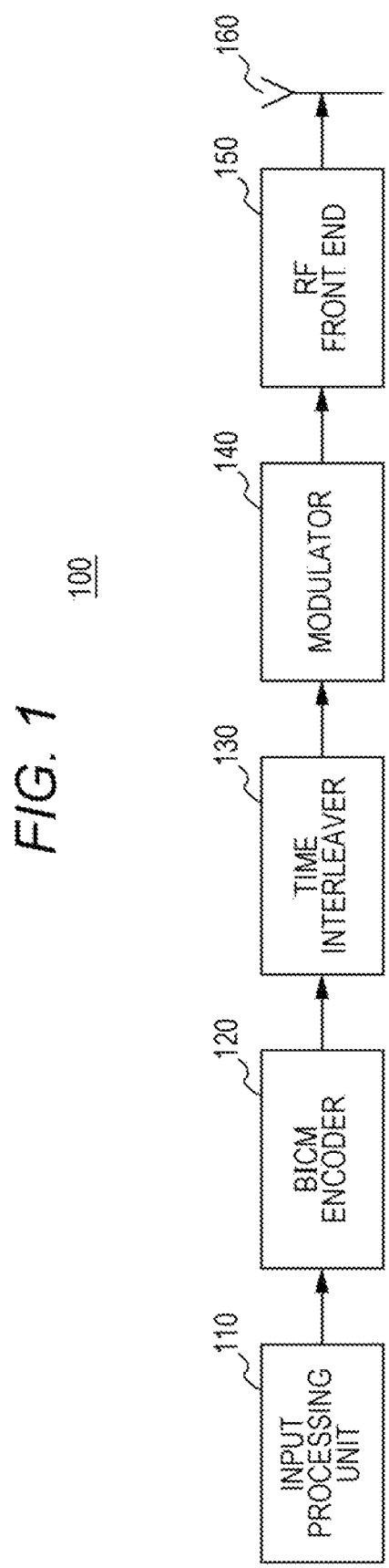
FIG. 1 is a block diagram illustrating a configuration example of a transmitter-side communication circuit including bit-interleaved coding and modulation.

FIG. 1 is a block diagram illustrating a configuration example of a transmitter-side communication circuit that uses bit-interleaved coding and modulation (BICM).

Transmitter 100 comprises input processing unit 110, BICM encoder 120, time interleaver 130, modulator 140, RF (radio frequency) front end 150, and antenna 160.

Input processing unit 110 converts a format of an input bit stream into a predetermined-length block called a baseband frame. BICM encoder 120 converts each baseband frame into a cell having a plurality of complex values, and outputs the cell. The cell having the plurality of complex values are further processed by a circuit including at least time interleaver 130, modulator 140, and RF front end 150. Time interleaver 130 performs time interleaving on output of BICM encoder 120. Modulator 140 performs processing in which, for example, orthogonal frequency-division multiplexing (OFDM) modulation is used on output of time interleaver 130, and typically performs time interleaving and frequency interleaving in order to improve diversity. RF front end 150 converts a digital signal output from modulator 140 into an analog RF (radio frequency) signal, and performs power amplification of the analog RF signal. RF front end 150 outputs the power-amplified analog RF signal to antenna 160, and the power-amplified analog RF signal is output from antenna 160 as a radio wave.

Referring to FIG. 1, time interleaver 130 is disposed between BICM encoder 120 and modulator 140.

Time interleaver 130 is used to reduce a burst error. Actually, a large number of cells existing in a neighborhood of an original data stream are not influenced by the burst error in the case that the plurality of cells is interleaved with respect to the time under presence of the burst error. Accordingly, the time interleaving facilitates restoration of loss data, for example in the case that a forward error correction code technique is used.

Some time interleaving technologies are well known in communication system technology fields such as DVB-C2, DVB-T2, and DVB-NGH. Multi-stage interleaving is used in almost systems. A logical interpretation hidden behind all the time interleaving methods is to rearrange the plurality of cells across some codewords.

For example, the time interleaving used in the DVB-T2 is row-column block interleaving. Conceptually, the row-column block interleaving is a method for writing the plurality of cells in a column direction (column-wise) in a matrix and reading the plurality of written cells in a row direction (row-wise) from the matrix.

Convolutional interleaving is another time interleaving. The convolutional interleaving is a method for writing the plurality of cells in a large-size FIFO (first in, first out) shift register. The convolutional interleaving can implement a time interleaving depth equal to that of the block interleaving with a half memory size of the block interleaving.

In the DVB-NGH specification (NPL 1), a hybrid interleaving scheme having a combination of the block interleaving and the convolutional interleaving is used in the time interleaving. Conceptually, the DVB-NGH time interleaver convolutional-interleaves a plurality of blocks each of which includes the plurality of cells. At this point, one block is called an interleaving unit (IU).

The combination of the block interleaving and the convolutional interleaving is mainly selected to enable time-frequency-slicing (TFS), and the TFS is a promising technology of increasing a multiplexing capacity.

Time interleaver 130 and a time deinterleaver corresponding to time interleaver will be described below.

Figure 2:
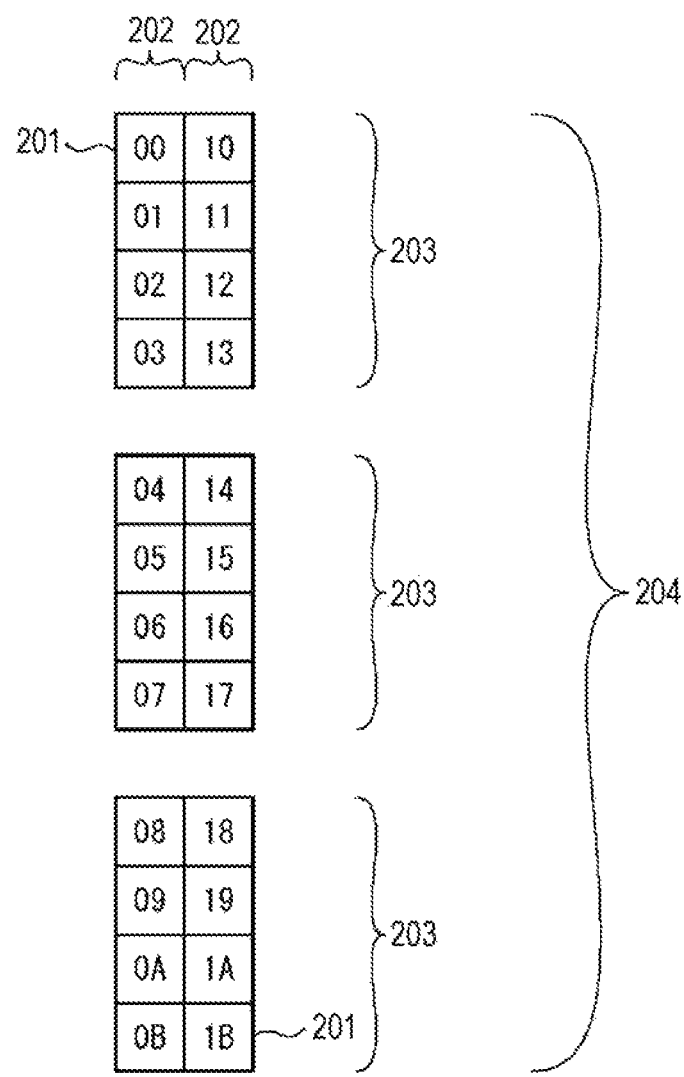
FIG. 2 is a view illustrating an outline example of a logical expression of data input to a time interleaver.

FIG. 2 illustrates an outline example of a logical expression of data input to time interleaver 130. However, one frame 204 is illustrated in FIG. 2.

Frame 204 includes a plurality of codewords 202, and each codeword 202 includes a plurality of cells 201. At this point, the number of codewords per frame is written as $N_{FEC\_TI}$, and the number of cells per codeword is written as $N_{cells}$. In the example of FIG. 2, $N_{FEC\_TI}=2$ and $N_{cells}=12$ are illustrated, and each frame 204 includes $N_{FEC\_TI}$ times $N_{cells}=2\times12=24$ cells.

Each frame 204 is logically divided into a plurality of interleaving units 203. At this point, the number of interleaving units per frame is written as $N_{IU}$. In the example of FIG. 2, $N_{IU}=3$ is illustrated.

A data structure in FIG. 2 is used to reveal how time interleaver 130 operates. The present disclosure is not limited to the data structure illustrated in FIG. 2, but implemented by other numerical values $N_{FEC\_TI}$, $N_{cells}$, and $N_{iu}$.

Although a minimum square in FIG. 2 corresponds to the cell, the reference mark 201 is partially added only to the square for the purpose of simplification. In two characters of each cell, the first character is a value that is conveniently provided in order to identify the codeword, and the second character is a value that is conveniently provided in order to identify the cell in each codeword. The same holds true for other drawings.

In the DVB-NGH standard, the input and output of time interleaver 130 and the input and output of the corresponding time deinterleaver are specified as illustrated in FIGS. 3A to 3C and FIGS. 4A to 4C.

Time interleaver 130 will be described below with reference to FIGS. 3A to 3C.

Figure 3A:
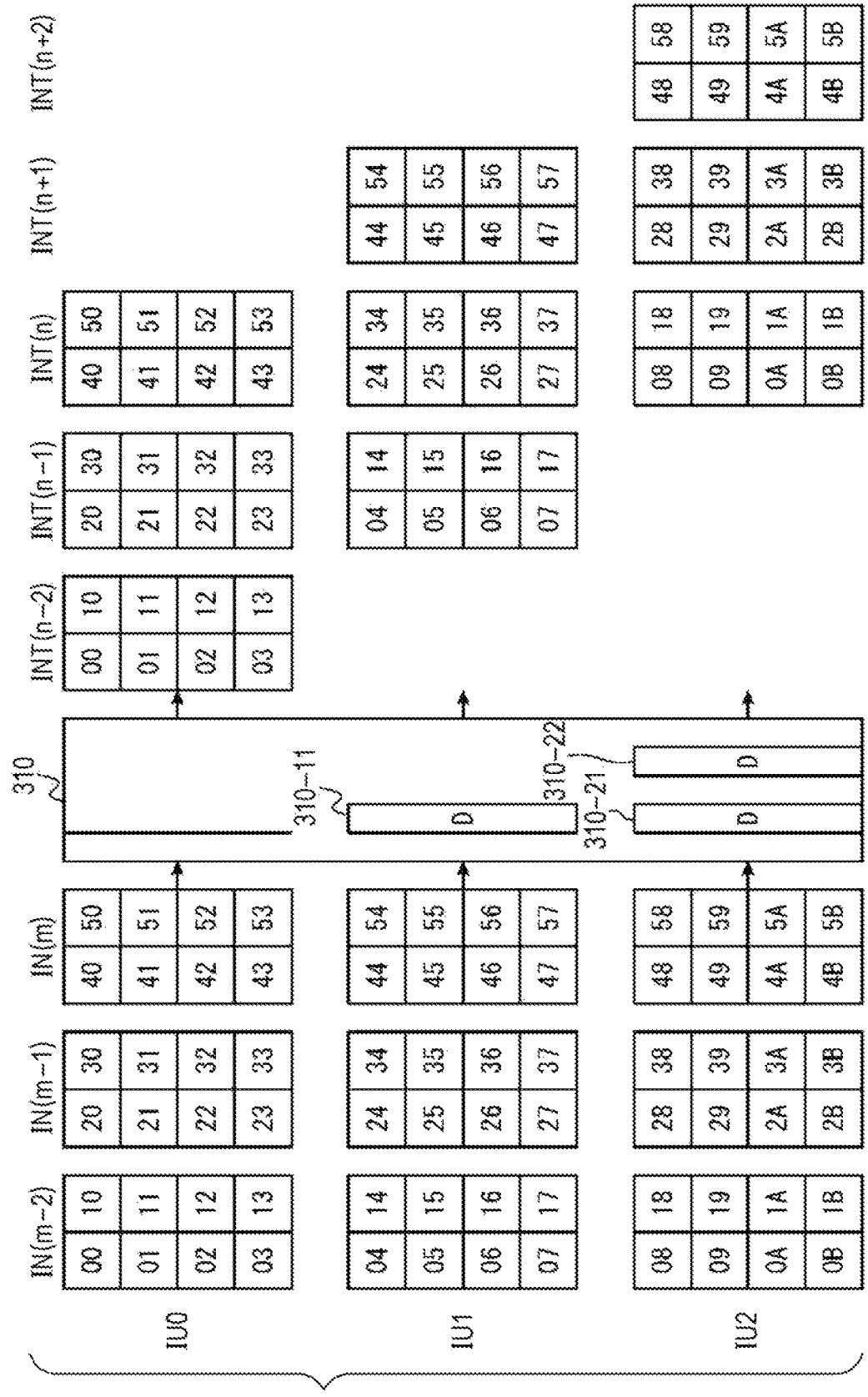
FIG. 3A is a view illustrating an outline example of a time-interleaver logical operation based on a DVB-NGH specification.

FIG. 3A illustrates an outline example of an initial operation of time interleaver 130 based on the DVB-NGH specification. The initial operation of time interleaver 130 includes processing of block-interleaving the codeword in which the interleaving unit is generated.

In the example of FIG. 3A, three consecutive input frames IN(m−2), IN(m−1), and IN(m) are indicated as the input to delay unit 310 of time interleaver 130. The input frame is input to delay unit 310 in the description order of IN(m−2), IN(m−1), and IN(m).

In each of input frames IN(m−2), IN(m−1), and IN(m), a plurality of interleaving units IU0, IU1, and IU2 are subjected to time delays different from one another by delay unit 310. The time delay includes a time delay "0".

In the example of FIG. 3A, each interleaving unit is subjected to the following time delay.

Non-existence of a delay line in the corresponding row of delay unit 310 shows that interleaving unit IU0 of each input frame is output without delay.

Existence of one delay line 310-11 in the corresponding row of delay unit 310 shows that interleaving unit IU1 of each input frame is output with a delay for one interleaving unit.

The existence of two delay lines 310-21 and 310-22 in the corresponding row of delay unit 310 shows that interleaving unit IU2 of each input frame is output with the delay for two interleaving units.

In the example of FIG. 3A, the output of delay unit 310 in the initial operation of time interleaver 130 is indicated by intermediate frames INT(n−2), INT(n−1), IN(n), INT(n+1), and INT(n+2). The intermediate frame is output from delay unit 310 in the description order of INT(n−2), INT(n−1), INT(n), INT(n+1), and INT(n+2).

Only intermediate frame INT(n) is complete in the example of FIG. 3A. On the other hand, in the preceding and subsequent intermediate frames, an input frame (not illustrated) is input to delay unit 310, subjected to the processing by delay unit 310, and output from delay unit 310, whereby the input frame becomes complete.

Delay lines 310-11, 310-21, and 310-22 of delay unit 310 are operated with respect to a cell group, namely, the interleaving unit, but not operated with respect to a single cell such as typical convolutional interleaving.

Figure 3B:
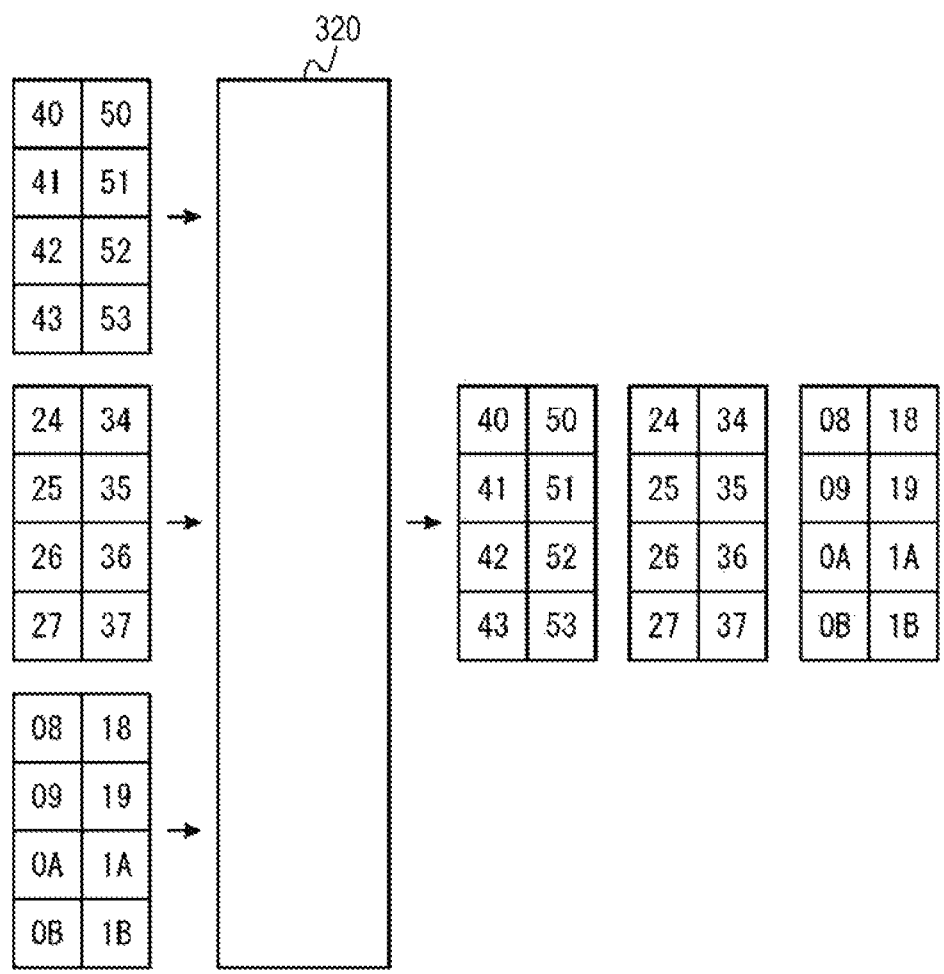
FIG. 3B is a view illustrating an outline example of the time-interleaver logical operation based on the DVB-NGH specification.

FIGS. 3B and 3C illustrate an outline example of a second operation of time interleaver 130 based on the DVB-NGH specification. The second operation of time interleaver 130 includes processing of horizontally stacking the plurality of interleaving units 203 from the left to the right with respect to each intermediate frame and then reading the cell in a row (row by row) direction.

More particularly, as illustrated in FIG. 3B, interleaving units IU0, IU1, and IU2 are horizontally stacked from the left to the light by stacking unit 320 of time interleaver 130 with respect to intermediate frame INT(n). As illustrated in FIG. 3C, the cells of the stacked interleaving units IU0, IU1, and IU2 are read and output in the row (row by row) direction by read unit 330 of time interleaver 130. An output result is expressed by output string OUT(n) in FIG. 3C, and the cells are output in the description order of 40, 50, 24, . . . , 19, 42, . . . , 37, 0B, and 1B.

In output string OUT(n), it is seen that the plurality of cells spread largely and advantageously using the codeword in a time interleaving depth. This is achieved by the stacking operation of stacking unit 320.

In the case that a receiver receives a cell stream corresponding to output string OUT(n), the time deinterleaver of the receiver performs a reverse operation of the operation performed by time interleaver 130. In short, the plurality of cells are divided into the plurality of interleaving units, and the plurality of interleaving units are perpendicularly stacked from the top to the bottom in order to reconstruct the frame, and subjected to the time delay.

A time deinterleaver will be described below with reference to FIGS. 4A to 4C.

Figure 4B:
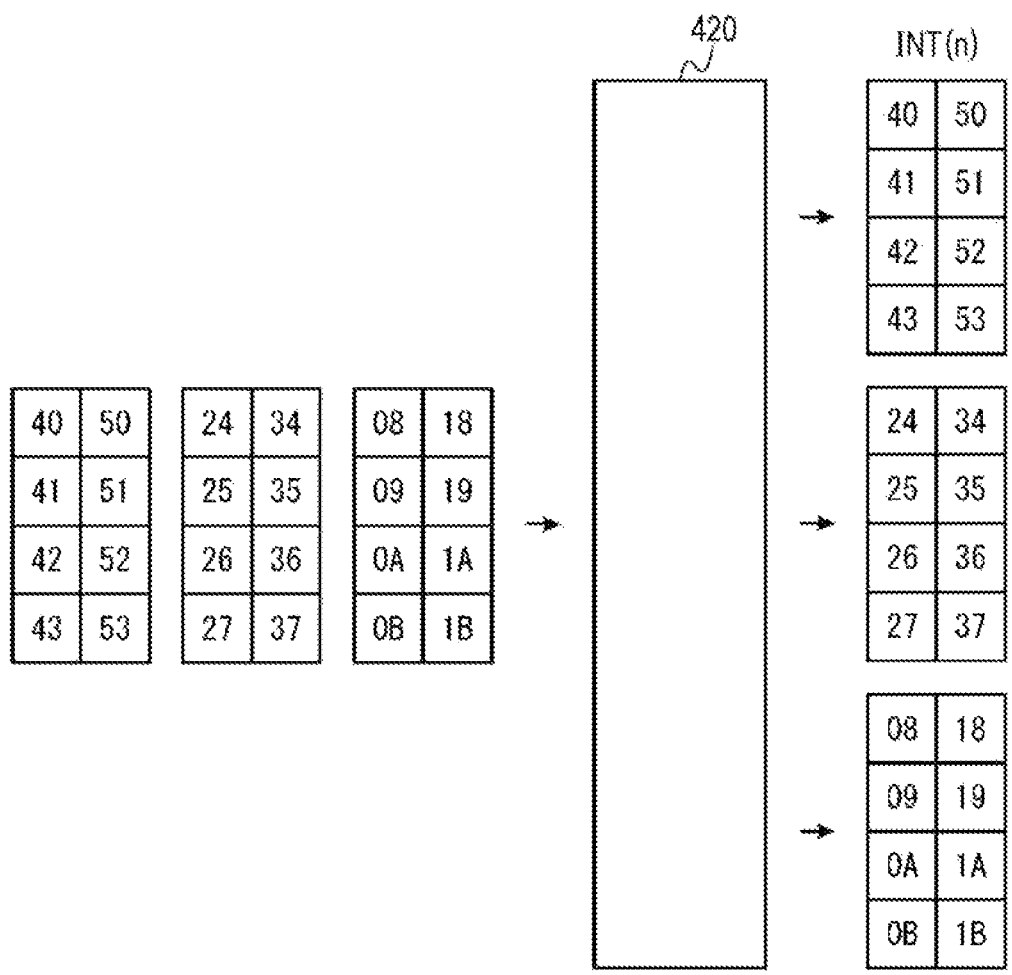
FIG. 4B is a view illustrating an outline example of the time-deinterleaver logical operation based on the DVB-NGH specification.

FIGS. 4A and 4B illustrate an outline example of the initial operation of the time deinterleaver based on the DVB-NGH specification. The initial operation of the time deinterleaver includes processing of receiving input stream IN(n) corresponding to output string OUT(n) output from time interleaver 130 on the transmitter side.

As illustrated in FIG. 4A, the plurality of cells of input stream IN(n) are input to separating unit 410 in the description order of 40, 50, 24, . . . , 19, 42, . . . , 37, 0B, and 1B, and reconstructed into the interleaving unit by separating unit 410.

As illustrated in FIG. 4B, the plurality of interleaving units are input to destacking unit 420, and reconstructed into the frame by destacking unit 420.

FIG. 4C illustrates an outline example of the second operation of the time deinterleaver based on the DVB-NGH specification.

In the example of FIG. 4C, five consecutive intermediate frames INT(n−2), INT(n−1), INT(n), INT(n+1), and INT(n+2) are indicated as the input to delay unit 430 of the time deinterleaver. The intermediate frames are input to delay unit 430 in the description order of INT(n−2), INT(n−1), INT(n), INT(n+1), and INT(n+2). For convenience, some intermediate frames are incompletely illustrated in FIG. 4C.

Delay unit 430 performs the reverse time delay of the time delay performed by delay unit 310 on the plurality of interleaving units. In the example of FIG. 4C, the existence of two delay lines 430-01 and 430-02 in the corresponding row of delay unit 430 shows that interleaving unit IU0 of each intermediate frame is output with the delay for two interleaving units. The existence of one delay line 430-11 in corresponding row of delay unit 430 shows that interleaving unit IU1 of each intermediate frame is output with the delay for one interleaving unit. The non-existence of the delay line in the corresponding row of delay unit 430 shows that interleaving unit IU0 of each intermediate frame is output without delay.

Frames OUT(p), OUT(p+1), and OUT(p+2) corresponding to originally-transmitted frames IN(m−2), IN(m−1), and IN(m) are restored through the pieces of processing.

However, the description about the time interleaver and time deinterleaver is only the logical description about the operation of the device and method of time interleaver 130 and the time deinterleaver. The implementation of the time interleaver and time deinterleaver implemented by some methods in each of which units 310 to 330 and units 410 to 430 are not always used. Particularly, data disposition and data movement in the defined two-dimensional matrix are selected only for the purpose of easily understanding the time interleaving processing and time deinterleaving processing such that defined two-dimensional matrices are disposed at different spatial positions associated with each other. In preferable implementation, physical recording of the data may be systematized in a memory having a two-dimensional array structure. However, the data is not always physically rearranged as described above, but the data may be simply logically rearranged using a proper addressing scheme.

The present disclosure provides a method for implementing the time interleaving and the time deinterleaving in association with reduction of usage of a resource, preferably reduction of usage of a memory in the time deinterleaver. The reduction of the usage of the memory in the time deinterleaver is effective in implementing the time interleaver on an electronic device that can potentially be carried, and the reduction of the memory leads advantageously to the reduction of the size and cost.

The associated time interleaving and time deinterleaving will be described below.

EXEMPLARY EMBODIMENT

Figure 5:
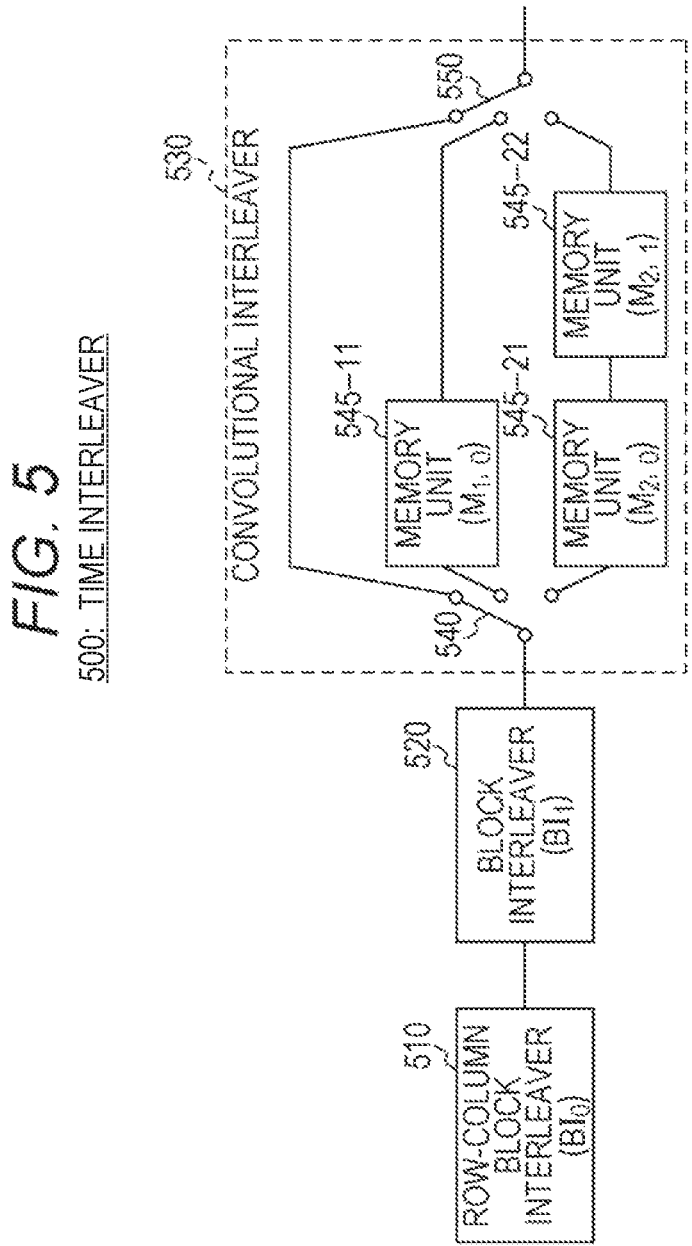
FIG. 5 is a block diagram illustrating an implementation example of a time interleaver according to an exemplary embodiment of the present disclosure.

FIG. 5 illustrates a configuration of an implementation example of a time interleaver according to an exemplary embodiment of the present disclosure. The time interleaving performed by the time interleaver in FIG. 5 is hybrid interleaving in which the block interleaving and the convolutional interleaving are combined.

Time interleaver 500 includes row-column block interleaver ($BI_0$) 510, block interleaver ($BI_1$) 520, and convolutional interleaver 530. Convolutional interleaver 530 logically includes switch 540, memory units ($M_{1,0}$, $M_{2,0}$, and $M_{2,1}$) 545-11, 545-21, and 545-22, and switch 550. The output of row-column block interleaver 510 is connected to the input of block interleaver 520, and the output of block interleaver 520 is connected to the input of convolutional interleaver 530.

FIG. 5 illustrates only the logical display, but time interleaver 500 is not physically constructed, namely, time interleaver 500 does not include a physical switch. However, it is clear for those skilled in the art that time interleaver 500 can be constructed with, for example, a memory and a processor.

Row-column block interleaver 510 in FIG. 5 will be described below.

Row-column block interleaver 510 includes a matrix having the number of rows equal to $N_{cells}/N_{iu}$ and the number of columns equal to $N_{iu}$. Where $N_{iu}$ is the number of interleaving units per frame, and $N_{cells}$ is the number of cells per codeword. For example, $N_{cells}=12$ and $N_{iu}=3$ are obtained for the frame structure in FIG. 2.

Figure 6A:
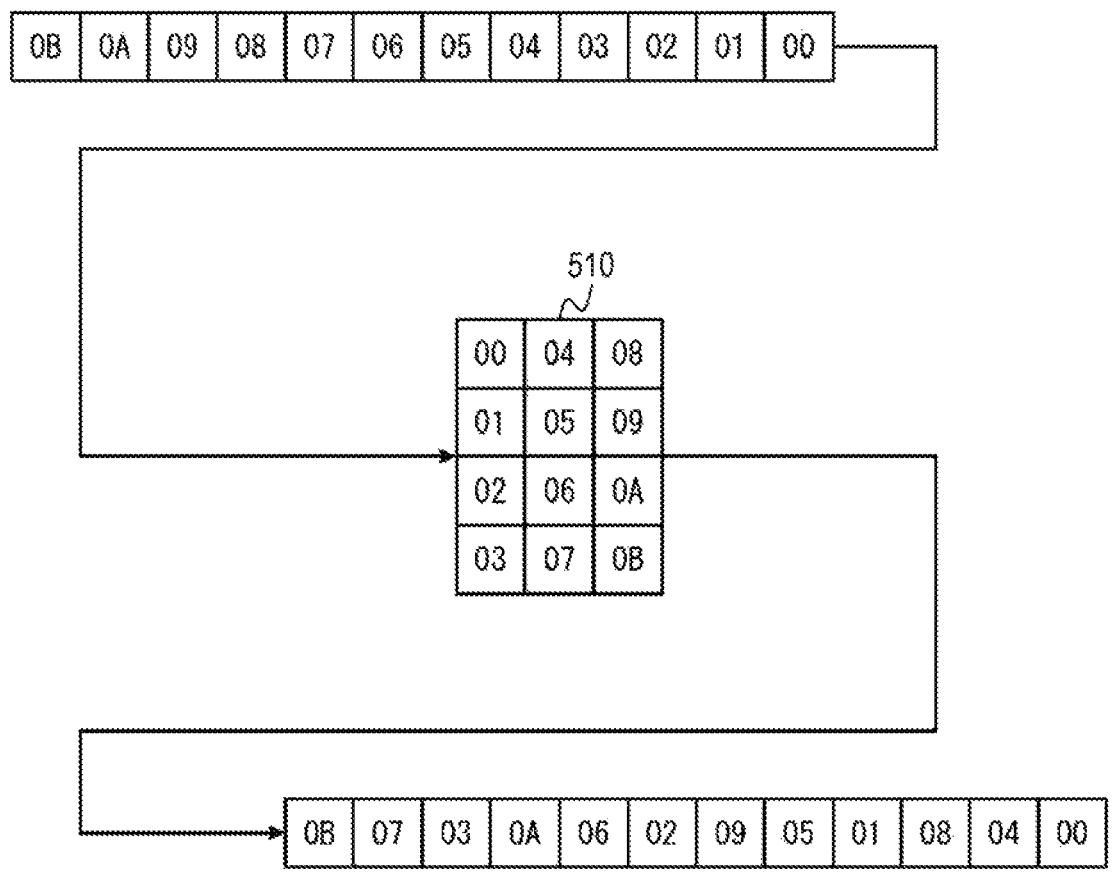
FIG. 6A is a view illustrating an outline of an operation example of a column-row block interleaver in FIG. 5.

FIG. 6A illustrates an implementation example of row-column block interleaver 510 for $N_{cells}=12$ and $N_{iu}=3$. In the example of FIG. 6A, 12 cells of a first codeword are input to row-column block interleaver 510 in the description order of 00, 01, 02, . . . , 09, 0A, and 0B.

As can be seen from FIG. 6A, row-column block interleaver 510 writes the cells 00 to 0B in the matrix in the column direction in the input order, and reads the cells 00 to 0B from the matrix in the row direction after the writing. As a result, the 12 cells of the first codeword are output from row-column block interleaver 510 in the description order of 00, 04, 08, 01, 05, 09, 02, 06, 0A, 03, 07, and 0B.

It is clear for those skilled in the art that the implementation of row-column block interleaver 510 is advantageously achieved using a linear memory block operated by an addressing scheme, which is described in the DVB-T2 implementation guideline (NPL 2) or described in PTL 1. The entire contents of NPL 2 and PTL 1 are hereby incorporated by reference.

Particularly, the row-column block interleaver tracks a memory position where the next cell is read, and reuses the memory position in order to write the currently-input cell. More particularly, address $a_{(i,j)}$ of an ith element of a jth time interleaving block is calculated based on Mathematical Formula 1 and Mathematical Formula 2. The jth time interleaving block and the ith element correspond to each codeword including the $N_{cells}$ cells (for the frame structure in FIG. 2, 12 cells) and an ith cell of each codeword, respectively.

$$a_{(i,j)}=(a_{(i,j)}+k_{(j)}) \bmod M+(a_{(i-1,j)}+k_{(j)}) \operatorname{div} M \quad \text{[Mathematical Formula 1]}$$

where $k_{(0)}=1, a_{(0,j)}=0, M=Nr \times Nc$

Where Nr is the number of rows, and Nc is the number of columns. As the codeword is input, j is incremented by one like j=0, . . . , and i is incremented like i=0, . . . , $N_{cells-1}$-1 (for the frame structure in FIG. 2, 11). Nr and Nc correspond to $N_{cells}/N_{iu}$ (for the frame structure in FIG. 2, 12/3=4) and $N_{iu}$ (for the frame structure in FIG. 2, 3), respectively.

In transmitter-side row-column block interleaver 510, $k_{(j)}$ is calculated using Mathematical Formula 2.

$$k_{(j)}=(k_{(j-1)} \times Nr) \bmod M+k_{(j-1)} \operatorname{div} Nc \quad \text{[Mathematical Formula 2]}$$

One of advantages of the technique given by Mathematical Formula 2 is that the cell can be written and read by one buffer, but that the writing operation and the reading operation need not to be switched between two buffers. This enables one block of a linear RAM (random access memory) to be used in the row-column block interleaving, and the row-column block deinterleaving because of similarity thereto. In regard to that, memory sizes of the actual row-column block interleaver and row-column block deinterleaver can conceptually be equalized to each other. For example, one memory block having a 12-cell memory space can be used in order to perform the row-column block interleaving or row-column block deinterleaving on one frame constructed with the 12 cells.

Block interleaver 520 in FIG. 5 will be described below.

Block interleaver 520 includes a matrix having the number of rows equal to $N_{cells}$ and the number of columns equal to $N_{FEC\_TI}$. Where $N_{cells}$ is the number of cells per codeword, and $N_{FEC\_TI}$ is the number of codewords per frame. For example, $N_{cells}=12$ and $N_{FEC\_TI}=2$ are obtained for the frame structure in FIG. 2. Similarly, each of block interleavers 520A and 520B includes a matrix having the number of rows equal to $N_{cells}$ and the number of columns equal to $N_{FEC\_TI}$.

Figure 6B:
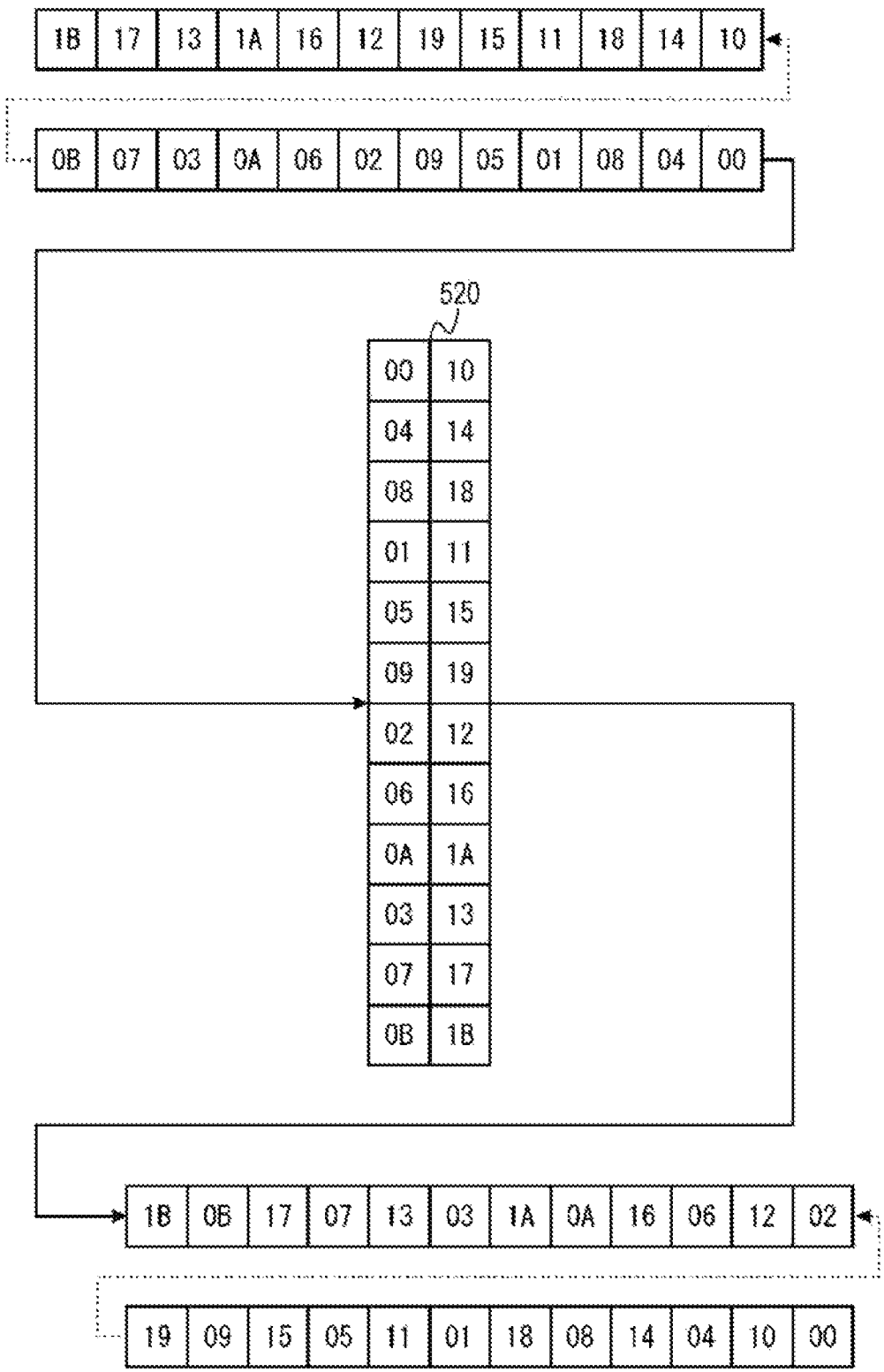
FIG. 6B is a view illustrating an outline of an operation example of a block interleaver in FIG. 5.

FIG. 6B illustrates an implementation example of block interleaver 520 for $N_{cells}=12$ and $N_{FEC\_TI}=2$. In the example of FIG. 6B, the 12 cells of the first codeword in one frame are input to block interleaver 520 in the order output from row-column block interleaver 510, in this case, the description order of 00, 04, 08, . . . , 03, 07, and 0B. Then the 12 cells of the next codeword in the one frame are output to block interleaver 520 in the order output from row-column block interleaver 510, in this case, the description order of 10, 14, 18, . . . , 13, 17, and 1B.

As illustrated in FIG. 6B, block interleaver 520 writes the cells 00 to 0B of the initial codeword in the matrix in the column direction in the order output from row-column block interleaver 510. Then, block interleaver 520 writes the cells 10 to 1B of the subsequent codeword in the matrix in the column direction in the order output from row-column block interleaver 510. Block interleaver 520 reads the cells 00 to 0B and 10-1B written in the matrix from the matrix in the row direction. As a result, the 24 cells of the first frame are output from block interleaver 520 in the description order of 00, 10, 04, . . . , 19, 02, . . . , 17, 0B, and 1B.

In this case, block interleaver 520 acts as the row-column block interleaver like row-column block interleaver 510. Accordingly the discussion similar to that of row-column block interleaver 510 can be applied to the implementation in which the addressing scheme given by Mathematical Formulae 1 and 2 can be used. In the case that the discussion is applied to block interleaver 520, the jth time interleaving block and the ith element correspond to each frame including $N_{FEC\_TI} \times N_{cells}$ cells (for the frame structure in FIG. 2, 2×12=24 cells) and ith cell of each frame, respectively. As the frame is input, j is incremented by one like j=0, . . . , and i is incremented like i=0, . . . , $N_{FEC\_TI} \times N_{cells-1} - 1$ (for the frame structure in FIGS. 2, 2×12−1=23). Nr and Nc correspond to $N_{cells}$ (for the frame structure in FIG. 2, 12) and $N_{FEC\_TI}$ (for the frame structure in FIG. 2, 2), respectively.

Another implementation example of block interleaver ($BI_1$) in time interleaver 130 will be described below.

Figure 6C:
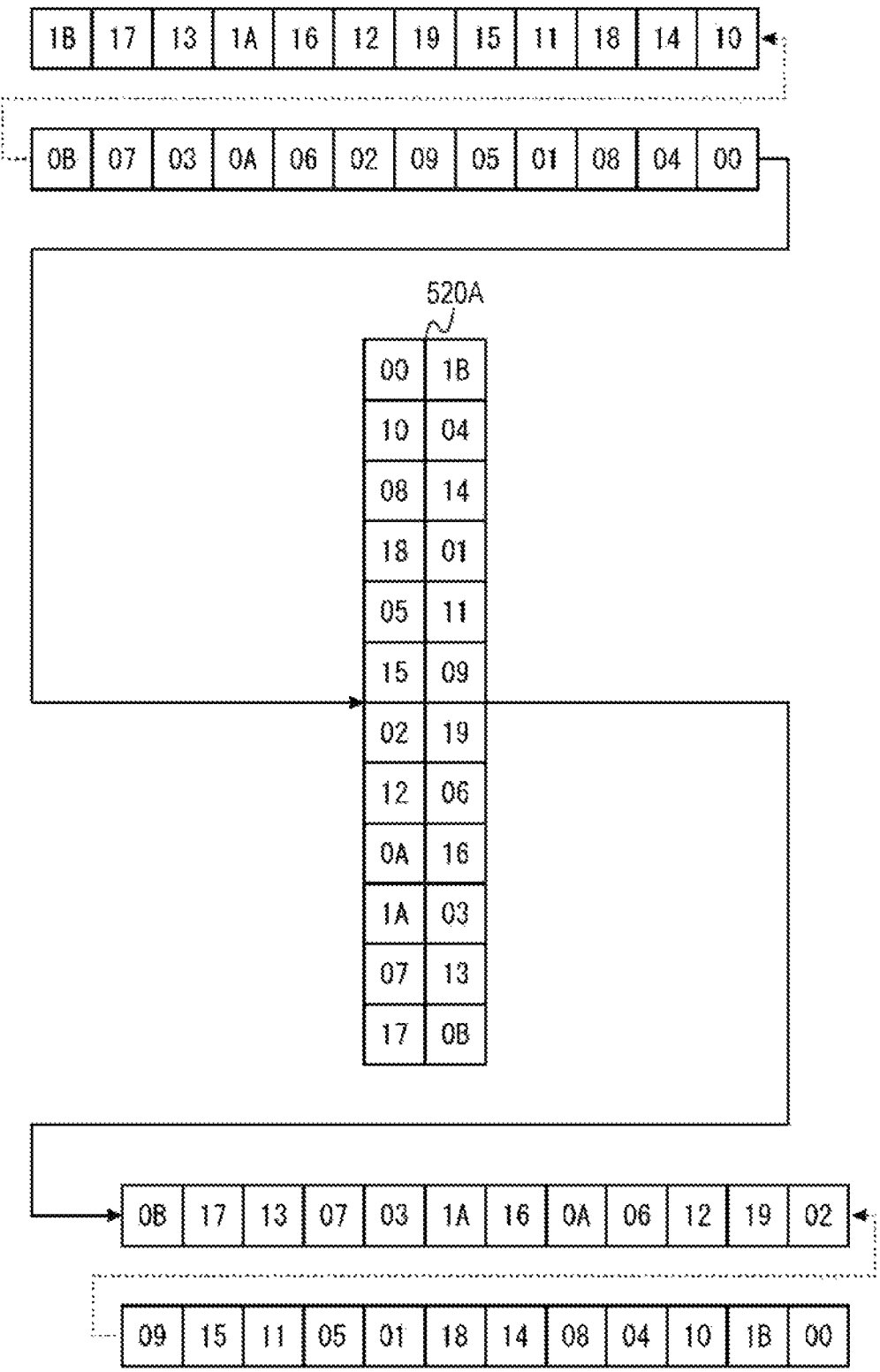
FIG. 6C is a view illustrating an outline of another operation example of the block interleaver in FIG. 5.

FIG. 6C illustrates another implementation example of block interleaver ($BI_1$) in the case identical to the numerical value example in FIG. 6B, namely, the case of $N_{cells}$=12 and $N_{FEC\_TI}$=2. However, in FIG. 6C, block interleaver ($BI_1$) is illustrated as block interleaver 520A. It is assumed that the input cell in FIG. 6C is identical to the input cell in FIG. 6B.

In the present disclosure, it is clear that block interleaver 520A can be implemented instead of block interleaver 520 in the case that block interleaver 520 is referred to.

As illustrated in FIG. 6C, block interleaver 520A writes the 12 cells 00 to 0B of the initial codeword in the matrix in the order output from row-column block interleaver 510. Then, block interleaver 520A writes the cells 10 to 1B of the subsequent codeword in the matrix in the order output from row-column block interleaver 510. However, the cells 00 to 0B and the cells 10 to 1B are not written in the column direction unlike block interleaver 520, but in a diagonal manner. Like block interleaver 520, block interleaver 520A reads the cells 00 to 0B and cells 10 to 1B, which are written in the matrix, from the matrix in the row direction. Resultantly, as illustrated in FIG. 6C, block interleaver 520A outputs the 24 cells of one frame in the description order of 00, 1B, 10, . . . , 09, 02, . . . , 13, 17, and 0B.

It is clear for those skilled in the art that the implementation of block interleaver 520A is advantageously achieved using a linear memory block operated by an addressing scheme, which is described in the DVB-C2 specification (NPL 3). The entire content of NPL 3 is hereby incorporated by reference.

Particularly, the block interleaver tracks the memory position where the next cell is read, and reuses the memory position in order to write the currently-input cell. More particularly, address $a_{(i,j)}$ of the ith element of the jth time interleaving block is calculated based on Mathematical Formula 3. The jth time interleaving block and the ith element correspond to each frame including the $N_{FEC\_TI} \times N_{cells}$ cells (for the frame structure in FIG. 2, 2×12=24 cells) and an ith cell of each frame, respectively.

$$a_{(i,j)} = Nc \times r_{(i,j)} + c_{(i,j)} \quad \text{[Mathematical Formula 3]}$$

where $i = 0, \ldots, Nr \times Nc - 1$ $c_{(i,j)} = \mod(i, Nc)$ $s_{(i,j)} = \mod(j \times c_{(i,j)}, NR)$ $r_{(i,j)} = \mod(\mathrm{floor}(i/Nc) - s_{(i,j)}, Nr)$ Where Nr is the number of rows, and Nc is the number of columns. As the frame is input, j is incremented by one like j=0, . . . , and i is incremented like i=0, . . . , $N_{FEC\_TI} \times N_{cells} - 1$ (for the frame structure in FIGS. 2, 2×12−1=23). Nr and Nc correspond to $N_{cells}$ (for the frame structure in FIG. 2, 12) and $N_{FEC\_TI}$ (for the frame structure in FIG. 2, 2), respectively.

Still another implementation example of block interleaver ($BI_1$) in time interleaver 130 will be described below.

Figure 6D:
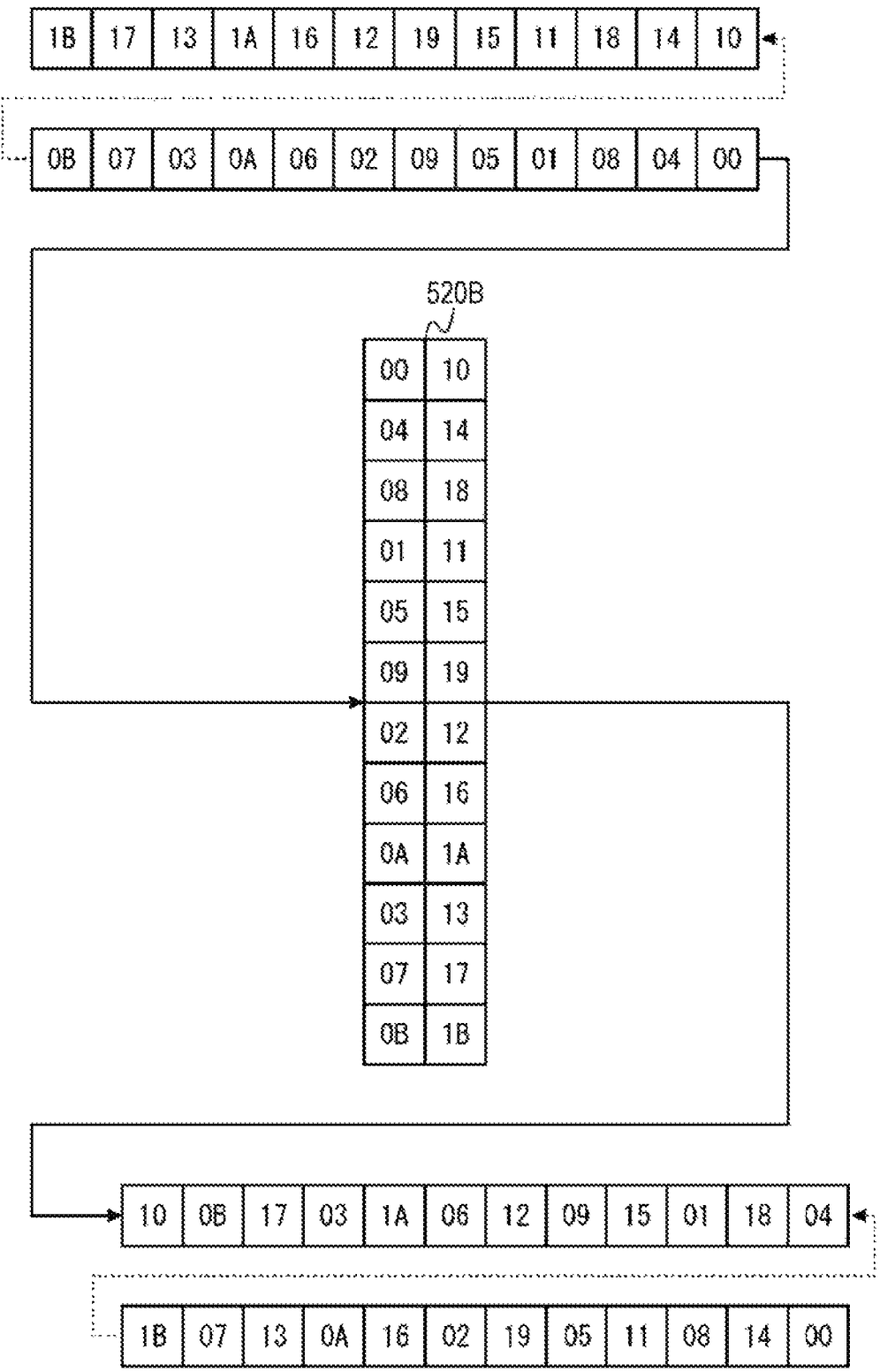
FIG. 6D is a view illustrating an outline of still another operation example of the block interleaver in FIG. 5.

FIG. 6D illustrates still another implementation example of block interleaver ($BI_1$) in the case identical to the numerical value example in FIG. 6B, namely, the case of $N_{cells}$=12 and $N_{FEC\_TI}$=2. However, in FIG. 6D, block interleaver ($BI_1$) is illustrated as block interleaver 520B. It is assumed that the input cell in FIG. 6D is identical to the input cell in FIG. 6B.

In the present disclosure, it is clear that block interleaver 520B can be implemented instead of block interleaver 520 in the case that block interleaver 520 is referred to.

As illustrated in FIG. 6D, block interleaver 520B writes the 12 cells 10 to 1B of the initial codeword in the matrix in the column direction in the order output from row-column block interleaver 510. Then, block interleaver 520B writes the cells 10 to 1B of the subsequent codeword in the matrix in the column direction in the order output from row-column block interleaver 510. However, block interleaver 520B performs row twist processing before the cell is read. After performing the row twist processing, block interleaver 520B reads the cells 00 to 0B and the cells 10 to 1B from the matrix in the row direction.

In other words, the cells 00 to 0B of the codeword are written in the matrix in the column direction, and the cells 10 to 1B of the subsequent codeword are written in the matrix in the column direction. The cells 00 to 0B and 10 to 1B written in the matrix are diagonally read from the matrix.

Resultantly, as illustrated in FIG. 6D, the 24 cells of one frame are output from block interleaver 520B in the description order of 00, 14, 08, . . . , 1B, 04, . . . ,17, 0B, and 10.

Block interleaver 520B is advantageously implemented using linear memory block operated by the addressing scheme for tracking the memory position where the next cell is read, the addressing scheme reusing the memory position in order to write the currently-input cell. More particularly, address $a_{(i,j)}$ of the ith element of the jth time interleaving block is calculated based on Mathematical Formula 4. The jth time interleaving block and the ith element correspond to each frame including the $N_{FEC\_TI} \times N_{cells}$ cells (for the frame structure in FIG. 2, 2×12=24 cells) and the ith cell of each frame, respectively.

[Mathematical Formula 4]

```
Shift=Nc/2+1 for mod(Nc,2)==0
Shift=(Nc+1)/2 for mod(Nc,2)==1
For j=0..N_frames-1{
    S=mod(S-Shift,Nc) with S=0 if j==0
    For i=0..Nr × Nc-1{
        R=mod(i,Nr)
        T=mod(s × R,Nc)
        C=mod(floor(i/Nr)-T,Nc)
        a_(i,j)=Nr × C+R
    }
}
```

Where Nr is the number of rows, and Nc is the number of columns. Nr and Nc correspond to $N_{cells}$ (for the frame structure in FIG. 2, 12) and $N_{FEC\_TI}$ (for the frame structure in FIG. 2, 2), respectively.

Block interleavers 520A and 520B supplement a cell interleaver, have an advantage replacing the cell interleaver therewith, or have an advantage that block interleavers 520A and 520B are disposed in front of row-column block interleaver 510. Therefore, block interleavers 520A and 520B are superior to block interleaver 520. Particularly, in the DVB-NGH, because the cell interleaver performs pseudo random permutation of the cell in the codeword, the cell interleaver needs to be disposed in front of row-column block interleaver 510. The cell interleave can be eliminated using block interleavers 520A and 520B.

Convolutional interleaver 530 in FIG. 5 will be described below.

Switches 540 and 550 move position of the connection destination by one after the $N_{FEC\_TI}$ cells pass. The number of positions connected to the switch, namely, the number of branches in convolutional interleaver 530 is equal to the number of interleaving units $N_{iu}$.

Figure 6E:
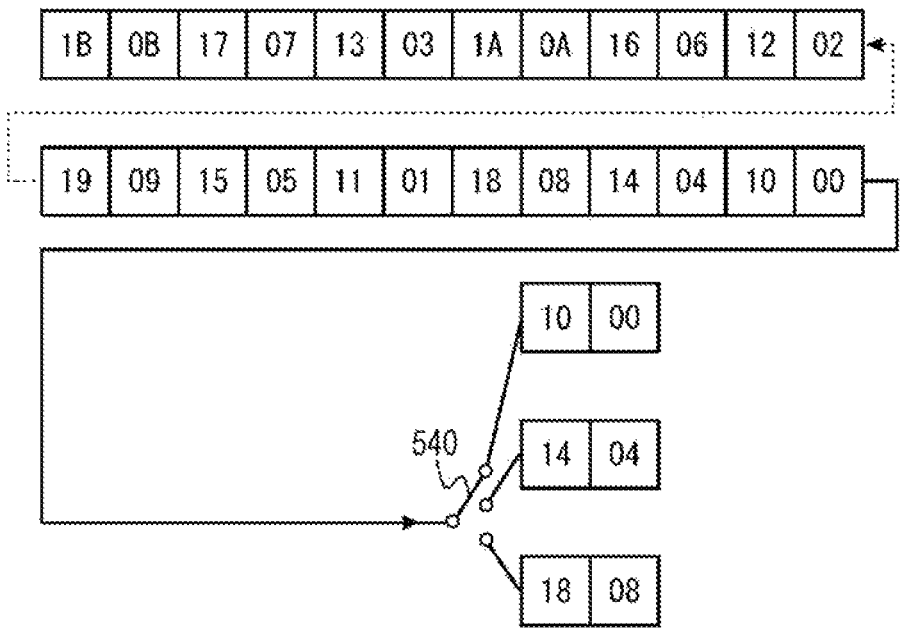
FIG. 6E is a view illustrating an outline of an operation example of an input-side switch in a convolutional interleaver in FIG. 5.
Figure 6F:
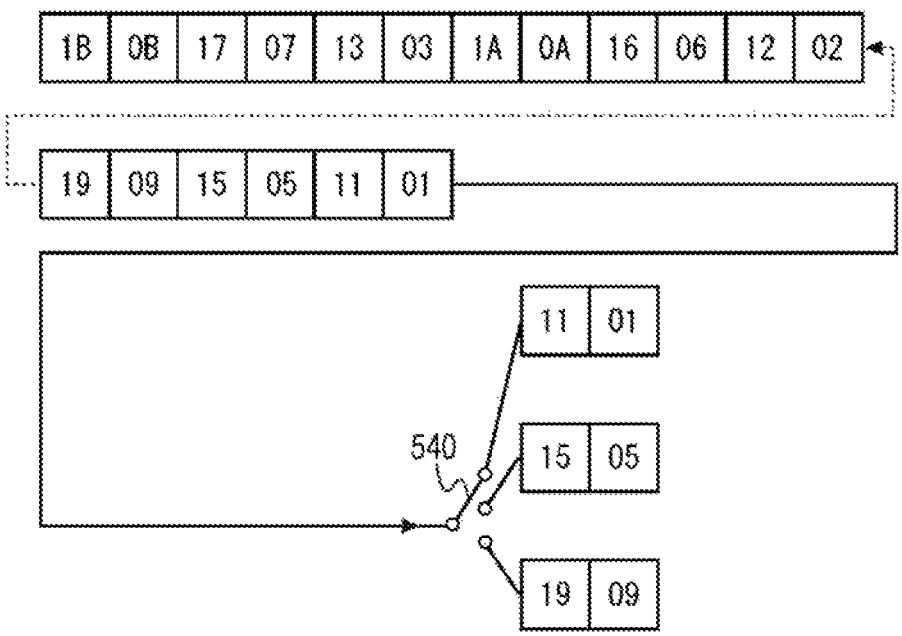
FIG. 6F is a view illustrating an outline of an operation example of the input-side switch in the convolutional interleaver in FIG. 5.

For the frame structure in FIG. 2, namely, for $N_{cells}=12$, $N_{FEC\_TI}=2$, and $N_{iu}=3$, FIG. 6E illustrates initial three steps of switch 540 and each output cell, and FIG. 6F illustrates the subsequent three steps and each output cell. At this point, in FIGS. 6E and 6F, the output cell of block interleaver 520 in FIG. 6B is used as the input cell, and the 24 cells for one frame arrive at switch 540 in the description order of 00, 10, 04, . . . , 19, 02, . . . , 17, 0B, and 1B.

As can be seen from FIGS. 6E and 6F, when the $N_{FEC\_TI}$ cells (2 cells) pass, switch 540 moves the connection destination from the topmost or second position to the position at one stage lower, or moves the connection destination from the lowermost position to the topmost position.

The cell output from switch 540 passes through the branch currently connected to switch 540. The topmost branch does not include an delay element, the branch lower than the topmost branch adds another delay element to the branch at one higher stage, and the branch includes delay elements, such as 1, 2, 3, and 4, toward the bottom Each delay element $M_{x,y}$ acts as a FIFO (first in, first out) shift register, and includes $N_{cells}/N_{IU} \times N_{FEC\_TI}$ memory cells. For example, for the frame structure of FIG. 2, namely, for $N_{cells}=12$, $N_{FEC\_TI}=2$, and $N_{iu}=3$, each delay element $M_{x,y}$ includes (12/3×2=) 8 memory cells. Delay element $M_{x,y}$ corresponds to memory units 545-11, 545-21, and 545-22 in FIG. 5.

The cell passing through the branch arrives at switch 550. When the $N_{FEC\_TI}$ cells (2 cells) pass, switch 550 moves the connection destination from the topmost or second position to the position at one stage lower, or moves the connection destination from the lowermost position to the topmost position.

Figure 6G:
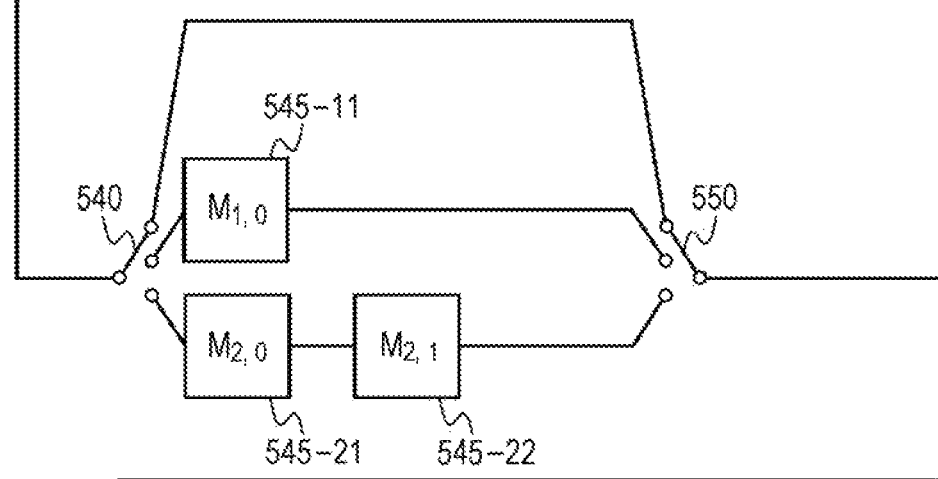
FIG. 6G is a view illustrating an outline of an operation example of the convolutional interleaver in FIG. 5.

FIG. 6G illustrates an outline of an operation example of convolutional interleaver 530 with respect to the initial three frames. In the output, storage contents of memory units 545-11, 545-21, and 545-22 proceed in a stepwise manner, thereby generating an empty cell. Particularly, in the example of FIG. 6G, three memory units 545-11, 545-21, and 545-22 retain a triple of 8 cells, namely, 24 cells in total corresponding to 24 empty cells in the output. The cells exist continuously from the cell 40.

It is clear for those skilled in the art that a ring buffer can be used to implement the delay line or memory units 545-11, 545-21, and 545-22. The ring buffer has an advantage that a physical copy of the memory unit is avoided. In the method in which the ring buffer is used, power consumption is effectively suppressed, which results in a large advantage for the mobile device.

Figure 7:
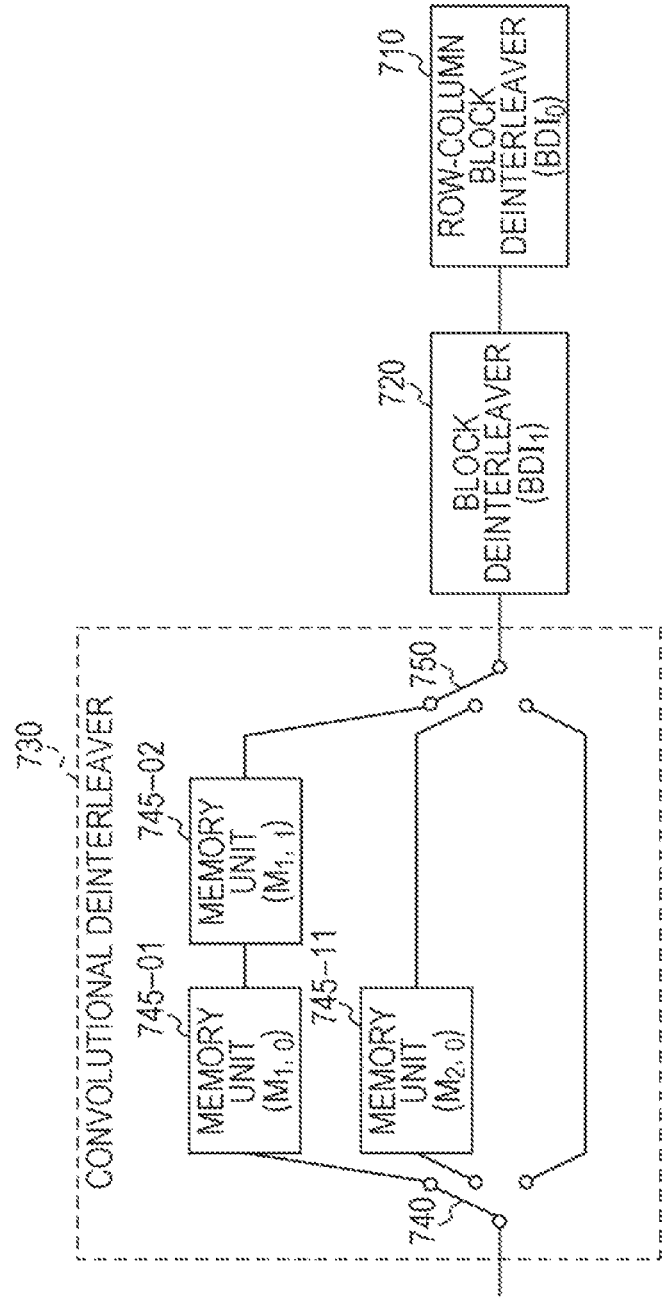
FIG. 7 is a block diagram illustrating a configuration of an implementation example of a time deinterleaver corresponding to the time interleaver in FIG. 5.

FIG. 7 illustrates a configuration of an implementation example of a time deinterleaver according to the exemplary embodiment of the present disclosure. The time deinterleaving performed by the time deinterleaver in FIG. 7 is hybrid deinterleaving in which convolutional deinterleaving and block deinterleaving are combined.

Time deinterleaver 700 includes convolutional deinterleaver 730, block deinterleaver (BDI$_1$) 720, and row-column block deinterleaver (BDI$_0$) 710. Convolutional deinterleaver 730 logically includes switch 740, memory units ($M_{1,0}$, $M_{1,1}$, and $M_{2,0}$) 745-01, 745-02, and 745-11, and switch 750. The output of convolutional deinterleaver 730 is connected to the input of block deinterleaver 720, and the output of the block deinterleaver 720 is connected to the input of row-column block deinterleaver 710. Time deinterleaver 700 has a sufficiently symmetrical relation to time interleaver 500.

Particularly, convolutional deinterleaver 730 is operated by the method sufficiently similar to the operation in FIGS. 6E to 6G of convolutional interleaver 530 with respect to the number of cells retained by memory units 745-01, 745-02, and 745-11 and moving speeds of switches 740 and 750.

Memory units 745-01, 745-02, and 745-11 include $N_{cells}/N_{IU} \times N_{FEC\_TI}$ memory cells. When the $N_{FEC\_TI}$ cells pass, switches 740 and 750 move the connection destination from the topmost or second position to the position at one stage lower, or move the connection destination from the lowermost position to the topmost position.

The detailed description is omitted.

Row-column block deinterleaver 710 in FIG. 7 will be described below.

Row-column block deinterleaver 710 includes a matrix having $N_{cells}/N_{IU}$ rows and $N_{IU}$ columns.

An implementation example of memory of row-column block deinterleaver 710 has a symmetrical relation to row-column block interleaver 510, and is obtained using the memory in which the addressing scheme is used. That is, address $a_{(i,j)}$ of the ith element of the jth time interleaving block is calculated using Mathematical Formula 5 and Mathematical Formula 6. The jth time interleaving block and the ith element correspond to each codeword including the $N_{cells}$ cells (for the frame structure in FIG. 2, 12 cells) and the ith cell of each codeword, respectively.

$$a_{(i,j)} = (a_{(i,j)} + k_{(j)}) \bmod M + (a_{(i,j)} + k_{(j)}) \operatorname{div} M \quad \text{[Mathematical Formula 5]}$$

where $k_{(0)}=1, a_{(0,j)}=0, M=Nr \times Nc$

Where Nr is the number of rows, and Nc is the number of columns. As the codeword is input, j is incremented by one like j=0, . . . , and i is incremented like i=0, . . . , $N_{cells-1}-1$ (for the frame structure in FIG. 2, 11). Nr and Nc correspond to $N_{cells}/N_{iu}$ (for the frame structure in FIG. 2, 12/3=4) and $N_{iu}$ (for the frame structure in FIG. 2, 3), respectively.

In receiver-side row-column block deinterleaver 710, kw is calculated using Mathematical Formula 6.

$$k_{(j)} = (k_{(j-1)} \times Nc) \bmod M + k_{(j-1)} \operatorname{div} Nr \quad \text{[Mathematical Formula 6]}$$

Block deinterleaver 720 in FIG. 7 will be described below.

Block deinterleaver 720 includes a matrix having $N_{cells}$ rows and $N_{IuFEc\_TI}$ columns.

An implementation example of memory of block deinterleaver 720 has a symmetrical relation to block interleaver 520, and is obtained using the memory in which the addressing scheme is used. The addressing scheme is given by Mathematical Formulae 5 and 6 for deinterleaving addressing on the receiver side as in row-column block deinterleaver 710. In the case that the discussion is applied to block deinterleaver 720, the jth time interleaving block and the ith element correspond to each frame including $N_{FEC\_TI} \times N_{cells}$ cells (for the frame structure in FIG. 2, 2×12=24 cells) and ith cell of each frame, respectively. As the frame is input, j is incremented by one like j=0, . . . , and i is incremented like i=0, . . . , $N_{FEC\_TI} \times N_{cells}$−1 (for the frame structure in FIGS. 2, 2×12−1=23). Nr and Nc correspond to $N_{cells}$ (for the frame structure in FIG. 2, 12) and $N_{FEC\_TI}$ (for the frame structure in FIG. 2, 2), respectively.

In the case that block interleaver 520A is used, the block deinterleaver corresponding to block interleaver 520A is implemented using the following addressing scheme. That is, address $a_{(i,j)}$ of the ith element of the jth time interleaving block is calculated using Mathematical Formula 7. The jth time interleaving block and the ith element correspond to each frame including the $N_{FEC\_TI} \times N_{cells}$ cells (for the frame structure in FIG. 2, 2×12=24 cells) and the ith cell of each frame, respectively.

$$a_{(i,j)} = Nc \times r_{(i,j)} + c_{(i,j)}$$ [Mathematical Formula 7]

where i=0, . . . ,Nr×Nc−1

$c_{(i,j)}$=mod(i,Nc)

$s_{(i,j)}$=mod(j×$c_{(i,j)}$, Nr)

$r_{(i,j)}$=mod($s_{(i,j)}$+floor(i/Nc),Nr)

Where Nr is the number of rows, and Nc is the number of columns. As the frame is input, j is incremented by one like j=0, . . . , and i is incremented like i=0, . . . , $N_{FEC\_TI} \times N_{cells-1}$−1 (for the frame structure in FIGS. 2, 2×12−1=23). Nr and Nc correspond to $N_{cells}$ (for the frame structure in FIG. 2, 12) and $N_{FEC\_TI}$ (for the frame structure in FIG. 2, 2), respectively.

In the case that block interleaver 520B is used, the block deinterleaver corresponding to block interleaver 520B is implemented using the following addressing scheme. That is, address $a_{(i,j)}$ of the ith element of the jth time interleaving block is calculated using Mathematical Formula 8. The jth time interleaving block and the ith element correspond to each frame including the $N_{FEC\_TI} \times N_{cells}$ cells (for the frame structure in FIG. 2, 2×12=24 cells) and the ith cell of each frame, respectively.

[Mathematical Formula 8]

```
Shift=Nc/2+1 for mod(Nc,2)==0
Shift=(Nc+1)/2 for mod(Nc,2)==1
For j=0..N_frames-1{
  S=mod(S-Shift,Nc) with S=0 if j==0
  For i=0..Nr × Nc-1{
    R=mod(i,Nr)
    T=mod(s × R,Nc)
    C=mod(T+floor(i/Nr),Nc)
    a_(i,j)=Nr × C+R
  }
}
```

Where Nr is the number of rows, and Nc is the number of columns. Nr and Nc correspond to $N_{cells}$ (for the frame structure in FIG. 2, 12) and $N_{FEC\_TI}$ (for the frame structure in FIG. 2, 2), respectively.

Simplified time interleaver and time deinterleaver according to another exemplary embodiment of the present disclosure will be described below. The time interleaver performs the hybrid interleaving in which the block interleaving and the convolutional interleaving are combined, and the time deinterleaver performs the hybrid deinterleaving in which the block deinterleaving and the convolutional deinterleaving are combined.

Row-column block interleaver 510 is a conventional row-column block interleaver in the case that the number of cells per codeword $N_{cells}$ is an integral multiple of the number of interleaving units $N_{IU}$. However, in the case that the number of cells per codeword $N_{cells}$ is not an integral multiple of the number of interleaving units $N_{IU}$, it is necessary to use the block interleaver that proceeds while skipping the subsequent cell.

According to the DVB-NGH specification, $L_{(IU,min)}$=floor($N_{cells}/N_{IU}$) holds. Where floor(x) is a maximum integer that does not exceed x. $N_{large}$=mod($N_{cells},N_{IU}$) and $N_{small}=N_{IU}-N_{large}$ are obtained. The initial $N_{large}$ interleaving units include $L_{(IU,min)}$+1 cells, and the next $N_{small}$ interleaving units include $L_{(IU,min)}$ cells. As a result, $N_{cells}=(L_{(IU,min)}+1) \times N_{large}+L_{(IU,min)} \times N_{small}$ is obtained.

Figure 8:
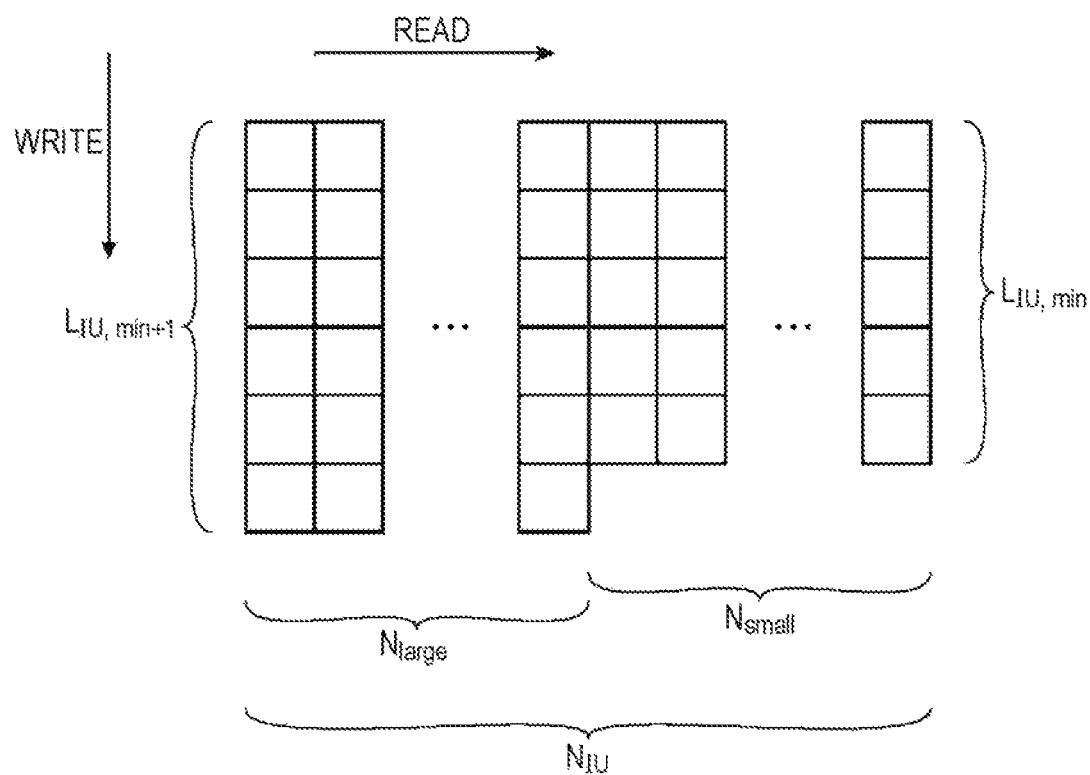
FIG. 8 is a view illustrating an outline of an implementation example of a block interleaver according to an exemplary embodiment of the present disclosure.

FIG. 8 illustrates an outline of an example of the row-column block interleaver. It is seen that the block interleaver cannot directly be implemented using the DVB-T2 addressing scheme in which the use of the memory is suppressed. In the measure of FIG. 8, it is necessary to skip over a predetermined cell, which results in a large-scale, complicated logic.

Figure 9:
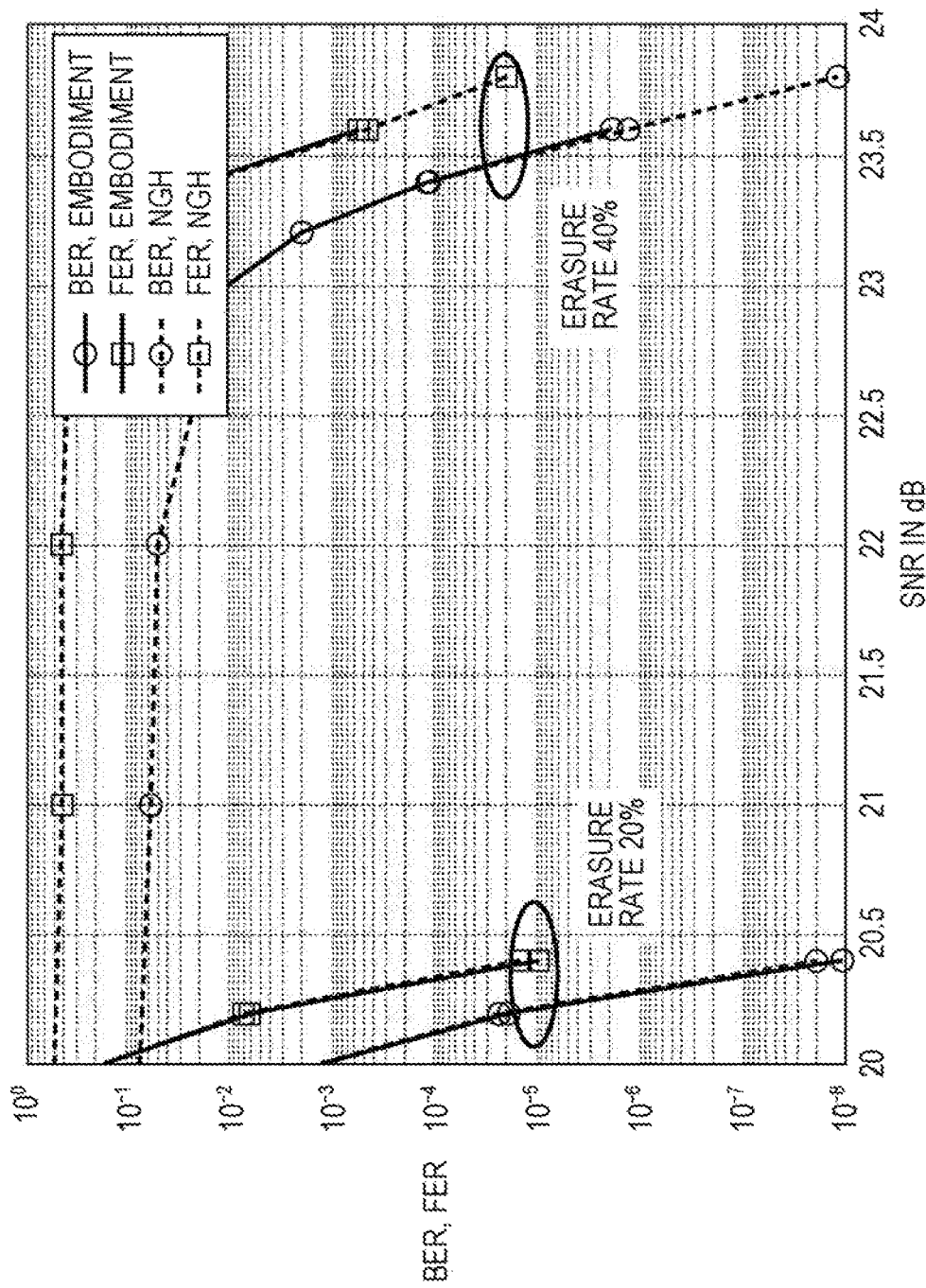
FIG. 9 is a view illustrating an outline of a simulation result.

The inventor found that row-column block interleaver 510 and row-column block deinterleaver 710 constitute outer components of the whole time interleaver circuit and whole time deinterleaver circuit. Accordingly, row-column block interleaver 510 and row-column block deinterleaver 710 can easily be removed from the time interleaver circuit and time deinterleaver circuit without influencing the whole function and without degrading the performance. FIG. 9 illustrates a simulation result supporting the fact found by the inventor.

Figure 10:
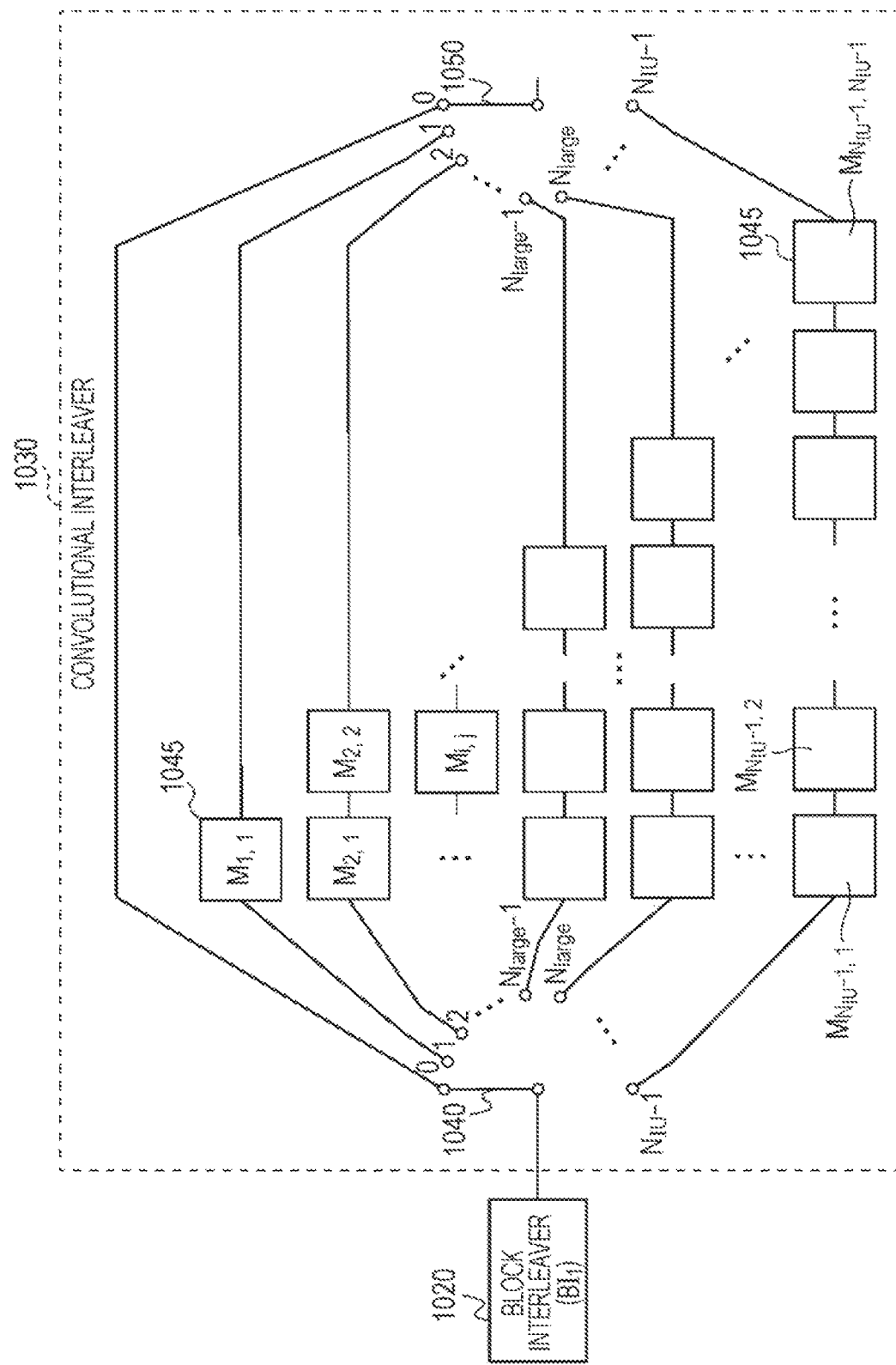
FIG. 10 is a block diagram illustrating a configuration of another implementation example of the time interleaver of the exemplary embodiment of the present disclosure.

FIG. 10 illustrates a configuration example of time interleaver 1000 adaptable to the simulation result.

Referring to FIG. 10, time interleaver 1000 includes block interleaver ($Bl_1$) 1020 and convolutional interleaver 1030, and convolutional interleaver 1030 includes switch 1040, a plurality of FIFO registers 1045, and switch 1050. Each square block in convolutional interleaver 1030 of FIG. 10 indicates FIFO register 1045. In switches 1040 and 1050, $M_{i,j}$ denotes jth FIFO register 1045 that is provided in the branch between position i (1 to $N_{IU-1}$) on the side of switch 1040 and position i (1 to $N_{IU-1}$) on the side of switch 1050.

Dispersion of the codeword is decided by switch 1040.

In an exemplary embodiment, after the $N_{FEC-TI}$ cells pass, switch 1040 moves so as to increment the position of the connection destination by one (0, 1, 2, . . . , $N_{IU-2}$, $N_{IU-1}$, 0, 1, . . . ). The operation of switch 1050 reproduces the operation of switch 1040. That is, after the $N_{FEC-TI}$ cells pass, switch 1050 moves so as to increment the position of the connection destination by one (0, 1, 2, . . . , $N_{IU-2}$, $N_{IU-1}$, 0, 1, . . . ).

In the present disclosure, switches 1040 and 1050 are not limited to the movement in which the position of the connection destination is incremented by one after the passage of the $N_{FEC\_TI}$ cells, but another increment can be performed. In the latter case, a size of each FIFO register 1045 is adjusted. For example, in the case that switches 1040 and 1050 switch while jumping every other position of the connection destination (that is, in the case that switches 1040 and 1050 move initially to all even-numbered positions 0, 2, 4, . . . and then move to all odd-numbered positions 1, 3, 5, . . . ), it is necessary that FIFO registers ($M_{i,j}$) 1045, which are associated with initial $N_{large}$ interleaving units and connected to initial $N_{large}$ positions to which switch 1040 is connected, be memories for $(L_{(IU,min)}+1) \times N_{FEC\_TI}$ memory cells. FIFO register $(M_{i,j})$ 1045, which are associated with other $N_{small}$ interleaving units and connected to other $N_{small}$ positions to which switch 1040 is connected, are memories for $L_{(IU,min)} \times N_{FEC\_TI}$ memory cells. There is an advantage that the codeword spreads in a large time span.

All the possible implementations described in any block interleaver described above, particularly block interleavers 520, 520A, and 520B can be used in block interleaver 1020.

In the transmitter, each FIFO register $(M_{i,j})$ 1045 has the size of $(L_{(IU,min)}+1) \times N_{FEC\_TI}$ memory cells in i=1, . . . , $N_{large}-1$ and j=1, . . . , and i, which are associated with the initial $N_{large}$ interleaving units, and has the size of $L_{(IU,min)} \times N_{FEC\_TI}$ memory cells in i=$N_{large}$, . . . , $N_{IU-1}$ and j=1, . . . , and i, which are associated with the next $N_{small}$ interleaving unit.

Figure 11:
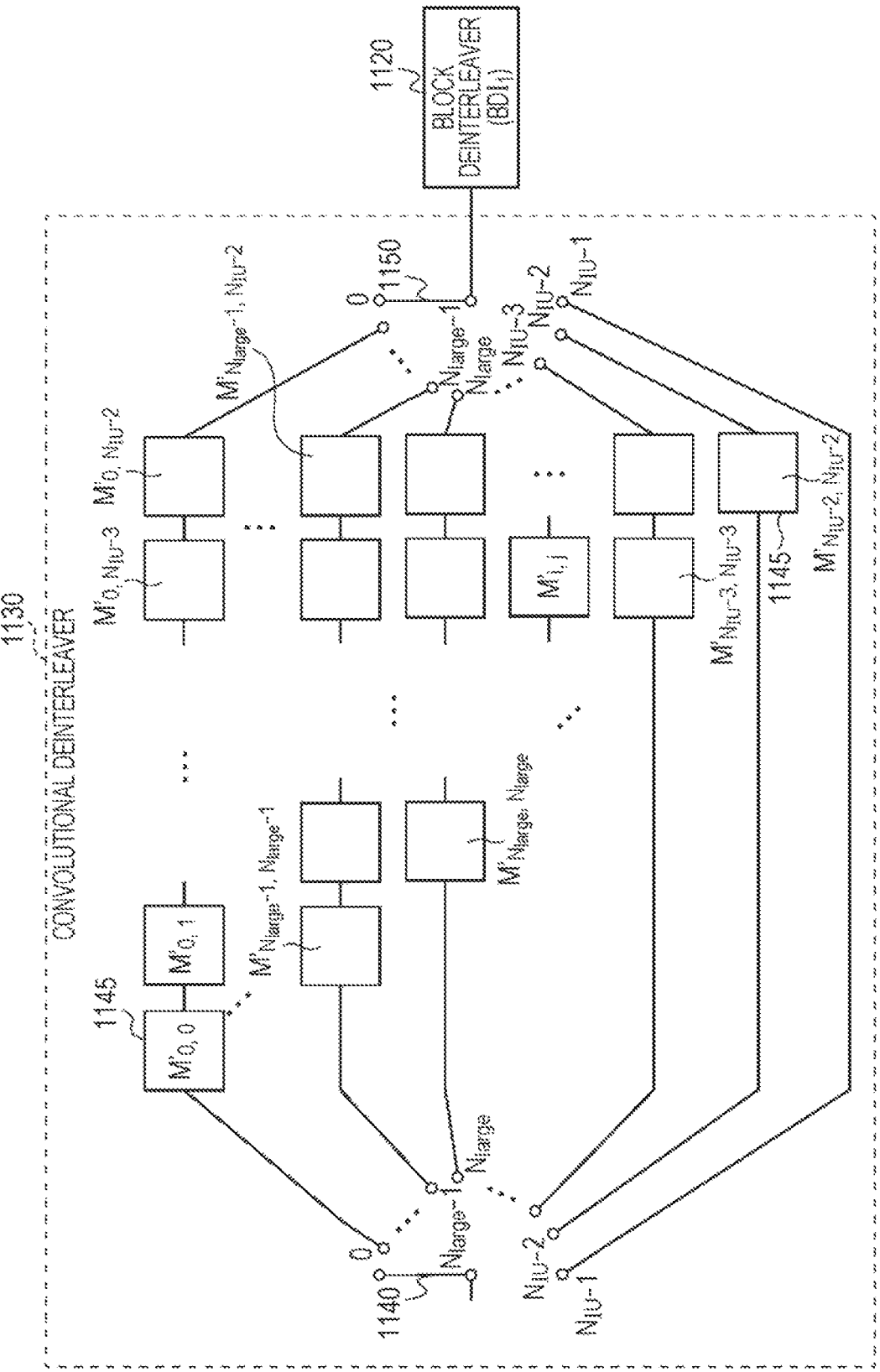
FIG. 11 is a block diagram illustrating a configuration of an implementation example of a time deinterleaver corresponding to the time interleaver in FIG. 10.

Time deinterleaver 1100 corresponding to time interleaver 1000 in FIG. 10 reflects the function of time interleaver 1000. FIG. 11 illustrates a configuration example of time deinterleaver 1100.

Referring to FIG. 11, time deinterleaver 1100 includes convolutional deinterleaver 1130 and block deinterleaver (BDI$_1$) 1120, and convolutional deinterleaver 1130 includes switch 1140, a plurality of FIFO registers 1145, and a switch 1150. In FIG. 11, each square block in convolutional deinterleaver 1130 indicates FIFO register 1145. In switches 1140 and 1150, $M'_{i,i+k-1}=M'_{i,j}$ denotes kth FIFO register 1145 that is provided in the branch between position i (0 to $N_{IU}-2$) on the side of switch 1140 and position i (0 to $N_{IU}-2$) on the side of switch 1150.

At this point, switches 1140 and 1150 operate according to switches 1040 and 1050. That is, switches 1140 and 1150 switch the position of the connection destination after the $N_{FEC-TI}$ cells pass, and the position switching order is identical to that of switches 1040 and 1050. The discussion on block deinterleaver 720 is also applied to block deinterleaver 1120.

Depending on whether $N_{cells}$ is an integral multiple of $N_{IU}$, the size of FIFO register $(M'_{i,j})$ 1145 differs from the size of FIFO register $(M_{i,j})$ 1045 of the transmitter, FIFO register $(M_{i,j})$ 1045 being paired with FIFO register $(M'_{i,j})$ 1145.

Particularly, in the case that $N_{cells}$ is an integral multiple of $N_{IU}$, all FIFO registers 1145 have an identical size, namely, $N_{cells}/N_{IU} \times N_{FEC\_TI}$.

Generally, in the case that $N_{cells}$ is not an integral multiple of $N_{iu}$, FIFO register $M'_{i,j}$ has the memory size of the $(L_{(IU,min)}+1) \times N_{FEC\_TI}$ memory cells for i=0, . . . , $N_{large}-1$ and j=i, . . . , $N_{IU}-2$, and has the memory size of the $L_{(IU,min)} \times N_{FEC\_TI}$ memory cells for i=$N_{large}$, . . . , $N_{IU}-2$ and j=i, . . . , $N_{IU}-2$.

Block deinterleaver 1120 cancels block interleaver 1020. As described in block deinterleaver 720, block deinterleaver 1120 can be constructed with any one of the block deinterleavers based on one block of the RAM and the associated addressing scheme.

Because the delay line is encapsulated by the block interleaver and the block deinterleaver, it is seen that the whole communication scheme confronts only the block interleaver and the block deinterleaver.

As proposed in the exemplary embodiment, although the removal of the outside row-column block interleaver (Bl$_O$) 510 and row-column block deinterleaver (BDI$_O$) 710 changes the transmitter transmission sequence in FIG. 3C, there is an advantage that the implementation is facilitated.

FIG. 9 illustrates a schematic simulation result in which performance of the DVB-NGH time interleaver is compared to performance of time interleaver 1000 of the exemplary embodiment. At this point, FIG. 9 illustrates the performance using an error curve to a signal-to-noise power ratio (SNR). As can be seen from FIG. 9, the performance of time interleaver 1000 does not degrade even if the outside row-column block interleaver (Bl$_O$) 510 and row-column block deinterleaver (BDI$_O$) 710 are removed, namely, the error curve associated with the DVB-NGH time interleaver agrees sufficiently with the error curve of time interleaver 1000 of the exemplary embodiment.

The simulation in which the result is illustrated in FIG. 9 includes a Rayleigh burst erasure channel accompanying a fixed erasure burst generated in a center period of the interleaved cell. The Rayleigh burst erasure channel emulates a propagation of radio communication passage accompanying serious shadowing. An erasure rate (20% and 40%) is associated with the time interleaving depth of the time interleaver. The simulation parameters are "modulation system: 256 non-uniform QAM", "LDPC codeword length Nldpc=64800, coding rate 9/15", "the number of interleaving unit: $N_{IU}$=15", "the number of codewords per interleaving unit: $N_{FEC\_TI}$=8", and "the number of interleaving frames: 30".

Although some exemplary embodiments are separately described above, it is clear for those skilled in the art that another exemplary embodiment can be made by a combination of the exemplary embodiments.

(Supplement)

The communication method and the like are summarized below.

(1) A first time interleaver is a time interleaver that performs time interleaving that includes convolutional interleaving on a plurality of cells. At this point, a convolutional interleaver that performs the convolutional interleaving comprises: a first switch that switches a connection destination of an input of the convolutional interleaver to one end of one of a plurality of branches, a number of which is same as a number of interleaving units on which a cell to be interleaved is disposed; FIFO (first in, first out) memories provided in some of the plurality of branches except one branch, wherein a number of FIFO memories is different among the plurality of branches except the one branch; and a second switch that switches a connection destination of an output of the convolutional interleaver to another end of one of the plurality of branches. The first switch switches the connection destination of the input of the convolutional interleaver when the plurality of cells as many as the codewords per frame have passed, by switching a corresponding branch of the connection destination sequentially and repeatedly among the plurality of branches. The second switch switches the connection destination of the output of the convolutional interleaver when the plurality of cells as many as the codewords per frame have passed, by switching a corresponding branch of the connection destination sequentially and repeatedly among the plurality of branches.

(2) A first time deinterleaver is a time deinterleaver that performs time deinterleaving that includes convolutional deinterleaving on a plurality of cells. At this point, a convolutional deinterleaver that performs the convolutional deinterleaving comprises: a first switch that switches a connection destination of an input of the convolutional deinterleaver to one end of one of a plurality of branches, a number of which is same as a number of interleaving units on which a cell to be deinterleaved is disposed; FIFO (first in, first out) memories provided in some of the plurality of branches except one branch, wherein a number of FIFO memories is different among the plurality of branches except the one branch; and a second switch that switches a connection destination of an output of the convolutional deinterleaver to another end of one of the plurality of branches. The first switch switches the connection destination of the input of the convolutional deinterleaver when the plurality of cells as many as the codewords per frame have passed, by switching a corresponding branch of the connection destination sequentially and repeatedly among the plurality of branches. The second switch switches the connection destination of the output of the convolutional deinterleaver when the plurality of cells as many as the codewords per frame have passed, by switching a corresponding branch of the connection destination sequentially and repeatedly among the plurality of branches.

(3) A first time interleaving method is a time interleaving method for performing time interleaving that includes convolutional interleaving on a plurality of cells. At this point, a time interleaver that performs the time interleaving method comprises a convolutional interleaver that performs the convolutional interleaving, the convolutional interleaver comprises: a first switch that switches a connection destination of an input of the convolutional interleaver to one end of one of a plurality of branches, a number of which is same as a number of interleaving units on which the cell to be interleaved is disposed; FIFO (first in, first out) memories provided in some of the plurality of branches except one branch, wherein a number of FIFO memories is different among the plurality of branches except the one branch; and a second switch that switches a connection destination of an output of the convolutional interleaver to another end of one of the plurality of branches. The first switch switches the connection destination of the input of the convolutional interleaver when the plurality of cells as many as the codewords per frame have passed, by switching a corresponding branch of the connection destination sequentially and repeatedly among the plurality of branches. The second switch switches the connection destination of the output of the convolutional interleaver when the plurality of cells as many as the codewords per frame have passed, by switching a corresponding branch of the connection destination sequentially and repeatedly among the plurality of branches.

(4) A first time deinterleaving method is a time deinterleaving method for performing time deinterleaving that includes convolutional deinterleaving on a plurality of cells. At this point, a time deinterleaver that performs the time deinterleaving method comprises a convolutional deinterleaver that performs the convolutional deinterleaving, the convolutional deinterleaver comprises: a first switch that switches a connection destination of an input of the convolutional deinterleaver to one end of one of a plurality of branches, a number of which is same as a number of interleaving units on which the cell to be deinterleaved is disposed; FIFO (first in, first out) memories provided in some of the plurality of branches except one branch, wherein a number of FIFO memories is different among the plurality of branches except the one branch; and a second switch that switches a connection destination of an output of the convolutional deinterleaver to another end of one of the plurality of branches. The first switch switches the connection destination of the input of the convolutional deinterleaver when the plurality of cells as many as the codewords per frame have passed, by switching a corresponding branch of the connection destination sequentially and repeatedly among the plurality of branches. The second switch switches the connection destination of the output of the convolutional deinterleaver when the plurality of cells as many as the codewords per frame have passed, by switching a corresponding branch of the connection destination sequentially and repeatedly among the plurality of branches.

INDUSTRIAL APPLICABILITY

The present disclosure can be used in the time interleaver that time-interleaves the plurality of cells and the time deinterleaver corresponding to the time interleaver.

REFERENCE MARKS IN THE DRAWINGS

100 transmitter
110 input processing unit
120 BICM encoder
130 time interleaver
140 modulator
150 RF front end
160 antenna
310 delay unit
320 stacking unit
330 read unit
410 separating unit
420 destacking unit
430 delay unit
500 time interleaver
510 row-column block interleaver
520, 520A, 520B block interleaver
530 convolutional interleaver
540 switch
545-11, 545-21, 545-22 memory unit
550 switch
700 time deinterleaver
710 row-column block deinterleaver
720 block deinterleaver
730 convolutional deinterleaver
740 switch
745-01, 745-02, 745-11 memory unit
750 switch
1000 time interleaver
1020 block interleaver
1030 convolutional interleaver
1040 switch
1045 FIFO register
1050 switch
1100 time deinterleaver
1120 block deinterleaver
1130 convolutional deinterleaver
1150 switch

The invention claimed is:

1. A transmitter comprising:
an input terminal into which cells are to be input from a block interleaver, the block interleaver including a matrix for block interleaving, the matrix having N columns, the cells being generated using low-density parity check (LDPC) coding;

an output terminal from which the cells are to be output such that each of the cells is classified in any one of M interleaving units;

a convolutional delay circuit comprising: M branches; and first in, first out (FIFO) registers to delay cells, a number of the FIFO registers provided in an M'th branch being M'-1, M' being an integer from 1 to M;

a first switch provided between the input terminal and the convolutional delay circuit;

a second switch provided between the convolutional delay circuit and the output terminal; and an antenna that transmits a radio wave according to the cells output from the output terminal, wherein the first switch and the second switch are each configured to connect to an identical branch of the M branches such that the input terminal and the output terminal are connected via the identical branch, and the first switch and the second switch are each configured to connect to an L+1th branch or a first branch when N cells are input into the input terminal while the first switch and the second switch each connect to an Lth branch, L being an integer from 1 to M.

2. A transmission method comprising:

reordering cells with a matrix having N columns for block interleaving, the cells being generated using low-density parity check (LDPC) coding;

inputting the cells into a convolutional delay circuit via a first switch after the cells are reordered, the convolutional delay circuit comprising:

M branches; and first in, first out (FIFO) registers to delay cells, a number of the FIFO registers provided in an M'th branch is M'-1, M' being an integer from 1 to M;

outputting the cells from the convolutional delay circuit via a second switch such that each of the cells is classified in any one of M interleaving units; and transmitting a radio wave according to the cells output from the convolutional delay circuit via the second switch, wherein the first switch and the second switch each connect to an identical branch of the M branches, and the first switch and the second switch each connect to an L+1th branch or a first branch when N cells are input into the convolutional delay circuit while the first switch and the second switch each connect to an Lth branch, L being an integer from 1 to M.

* * * * *